United States Patent
Asahata et al.

(10) Patent No.: US 10,014,155 B2
(45) Date of Patent: Jul. 3, 2018

(54) MICROSAMPLE STAGE AND METHOD OF MANUFACTURING THE SAME

(71) Applicant: HITACHI HIGH-TECH SCIENCE CORPORATION, Minato-ku, Tokyo (JP)

(72) Inventors: Tatsuya Asahata, Tokyo (JP); Akito Mori, Kagawa (JP); Asumi Yuzuriha, Kagawa (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/181,702

(22) Filed: Jun. 14, 2016

(65) Prior Publication Data
US 2016/0372301 A1    Dec. 22, 2016

(30) Foreign Application Priority Data

Jun. 16, 2015    (JP) .................................. 2015-121312

(51) Int. Cl.
*H01J 37/20*    (2006.01)
*H01J 37/28*    (2006.01)

(52) U.S. Cl.
CPC .............. *H01J 37/20* (2013.01); *H01J 37/28* (2013.01); *H01J 2237/2007* (2013.01)

(58) Field of Classification Search
None
See application file for complete search history.

(56) References Cited

U.S. PATENT DOCUMENTS

| 6,002,136 A | * | 12/1999 | Naeem | ................... | B82Y 35/00 |
| | | | | | 250/442.11 |
| 7,725,278 B2 | * | 5/2010 | Tomimatsu | ........ | G05B 23/0264 |
| | | | | | 250/309 |
| 7,888,655 B2 | * | 2/2011 | van Gaasbeek | ........ | H01J 37/20 |
| | | | | | 250/442.11 |

(Continued)

FOREIGN PATENT DOCUMENTS

| JP | 11258130 A | * | 9/1999 | ............... G01N 1/32 |
| JP | 11329325 A | * | 11/1999 | ............. H01J 37/20 |

(Continued)

OTHER PUBLICATIONS

Chamfer. (2011). In the Editors of the American Heritage Dictionaries (Ed.), The American Heritage dictionary of the English language (5th ed.). Boston, MA: Houghton Mifflin. Retrieved from http://search.credoreference.com/content/entry/hmdictenglang/chamfer/0.*

*Primary Examiner* — Michael Logie
(74) *Attorney, Agent, or Firm* — Adams & Wilks

(57) ABSTRACT

A microsample stage which fixes microsamples when the microsamples are analyzed by an analyzer includes a base, and middle supports which protrude from an upper surface of the base. A microsample-fixing portion protrudes from an upper surface of each middle support. An alignment mark associated with each microsample-fixing portion is configured to be recognized by a capturing image to determine a position of attachment of one or more microsamples to each microsample-fixing portion. The microsample stage is made by etching a silicon member, which can be automated to increase work efficiency.

7 Claims, 69 Drawing Sheets

(56) References Cited

U.S. PATENT DOCUMENTS

| | | | | |
|---|---|---|---|---|
| 2012/0006711 A1* | 1/2012 | Goodman | .............. | H01J 37/20 206/456 |
| 2012/0085937 A1* | 4/2012 | Coyle | .................... | G01N 1/32 250/492.3 |
| 2012/0133757 A1* | 5/2012 | Thomas | ................ | G02B 21/34 348/80 |
| 2015/0294834 A1* | 10/2015 | Routh, Jr. | .............. | H01J 37/26 250/307 |
| 2015/0348751 A1* | 12/2015 | Brogden | ................ | H01J 37/26 250/307 |
| 2016/0356683 A1* | 12/2016 | Krause | .................... | G01N 1/44 |

FOREIGN PATENT DOCUMENTS

| | | | | |
|---|---|---|---|---|
| JP | 2005345347 | | 12/2005 | |
| JP | 2011047660 A | * | 3/2011 | .............. G01N 1/28 |

* cited by examiner

MICROSAMPLE STAGE AND METHOD OF MANUFACTURING THE SAME

CROSS REFERENCE TO RELATED APPLICATION(S)

This application claims the benefit of Japanese Patent Application No. 2015-121312, filed Jun. 16, 2015, which is hereby incorporated by reference in its entirety into this application.

BACKGROUND OF THE INVENTION

1. Technical Field

The present invention relates to a microsample stage and a method of manufacturing the same.

2. Description of the Related Art

When analyzing a semiconductor device, a magnetic device, or a bio material, a microsample separated from this device or material is first fixed to a microsample stage. Then, the microsample fixed to the microsample stage is analyzed with a transmission electron microscope (TEM) or a scanning electron microscope (SEM) for determination of the sample's structure or feature, or analyzed with an X-ray diffraction analyzer for determination of the sample's composition.

A conventional microsample stage for supporting a microsample thereon has a structure in which a micro microsample-fixing portion having a thin wall form is installed on the upper surface of a semicircular metal base. In use of this microsample stage, a microsample is fixed to the upper or side surface of the micro microsample-fixing portion. Patent Document 1 discloses a microsample stage for supporting a microsample thereon for analysis of the microsample.

However, the microsample stage disclosed in Patent Document 1 has a problem in that it is difficult to automatically attach a micro sample to a predetermined position of a micro microsample-fixing portion.

DOCUMENT OF RELATED ART

Patent Document

Patent Document 1: Japanese Patent Application Publication No. 2005-345347

SUMMARY OF THE INVENTION

Accordingly, the present invention has been made keeping in mind the above problems occurring in the prior art, and an object of the present invention is to provide a microsample stage that is configured to automatically position a microsample at a predetermined position of a microsample-fixing portion thereof by detecting an alignment mark using an image-capturing device, and to provide a method of manufacturing the microsample stage.

According to one aspect of the present invention, there is provided a microsample stage including a base, a microsample-fixing portion that is formed on an upper surface of the base portion and to which a microsample is fixed, and an alignment mark.

According to another aspect of the present invention, there is provided a method of manufacturing a microsample stage, including: etching a silicon member to form a microsample stage including a base, a microsample-fixing portion to which a microsample is fixed, and an alignment mark.

According to the present invention, it is possible to automatically position a microsample at a predetermined position of a microsample-fixing portion of a microsample stage by detecting an alignment mark using am image-capturing device.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
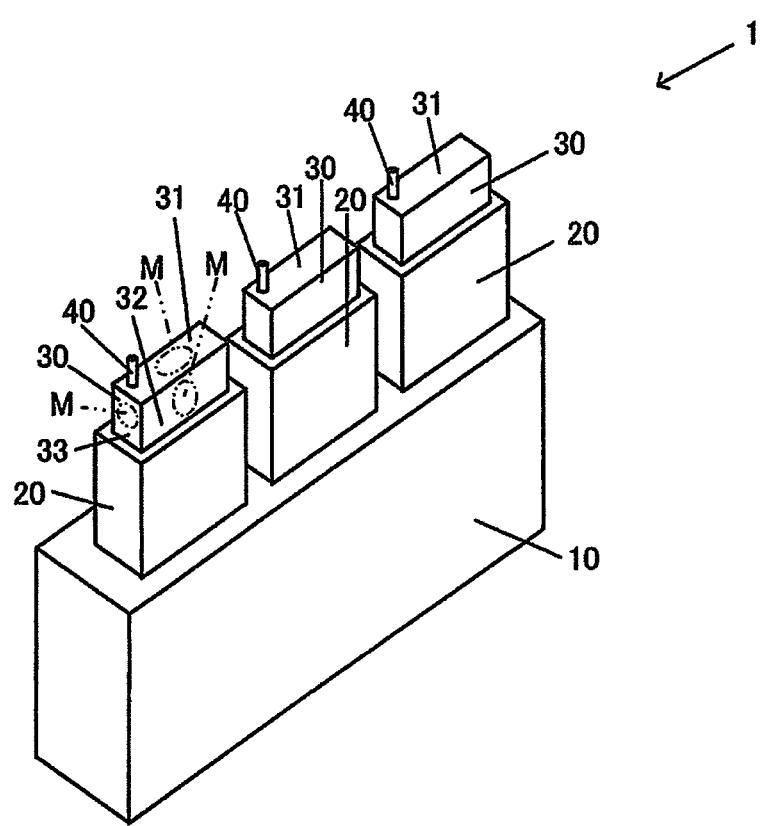
FIG. 1 is a perspective view illustrating an appearance of a microsample stage according to Embodiment 1.

The present invention will be described in detail below with reference to the accompanying drawings. Repeated descriptions and descriptions of known functions and configurations that have been deemed to make understanding of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Embodiment 1

[Structure of Microsample Stage]

Herein below, a microsample stage 1 according to Embodiment 1 will be described with reference to the accompanying drawings.

FIG. 1 is a perspective view illustrating appearance of the microsample stage 1 according to Embodiment 1.

The microsample stage 1 includes a base 10, three middle supports 20, three microsample-fixing portions 30, and three alignment marks 40. The base 10, the three middle supports 20, the three microsample-fixing portions 30, and the three alignment marks 40 are made of silicon and are provided as an integrated single body The base 10 takes a rectangular parallelepiped shape with a length of about 1 mm, for example. Alternatively, the base 10 may have a semicircular shape or an arc shape. The three middle supports 20 are arranged on the upper surface of the base 10 in the longitudinal direction of the base 10. Each of the middle supports 20 has a rectangular parallelepiped shape and has a thickness that is smaller than that of the base 10. Each middle support 20 is positioned in a center portion of the base 10 in the thickness direction. In the present embodiment, the three middle supports 20 are the same in length, thickness, and height. However, the three middle supports 20 may be different from each other in any at least one of length, thickness, and height.

The microsample-fixing portions 30 are installed on the upper surfaces of the respective middle supports 20 and have a rectangular parallelepiped shape. The length and thickness of microsample-fixing portion 30 are smaller than those of the middle support 20. Each microsample-fixing portion 30 is positioned in a center portion of the upper surface of the corresponding middle support 20 in the thickness direction. The microsample-fixing portion 30 has a-thickness of, for example, about 5 μm. The three microsample-fixing portions 30 may be substantially the same in length, thickness, and height. Alternatively, the three microsample-fixing portions 30 may be different from each other in at least any one of length, thickness, and height.

The alignment marks 40 are installed on the upper surfaces 31 of the microsample-fixing portions 30. Each alignment mark 40 is a protrusion that protrudes from the upper surface 31 of the microsample-fixing portion 30. The protrusion serving as the alignment mark 40 has a cylinder shape. The diameter of the protrusion is smaller than the thickness of the microsample-fixing portion 30. The protrusion is arranged not in a center portion of the microsample-fixing portion 30 but is arranged at a periphery portion of the microsample-fixing portion 30 in the lengthwise direction. The protrusion is also arranged to deviate from the center portion of the microsample-fixing portion 30 in the thickness direction. The protrusion may have a prism shape. The number of the middle supports 20 or the microsample-fixing portions 30 is not limited to three (3). The number may be two (2) or four (4). The number may also be one (1).

Microsamples M are fixed to side surfaces of each microsample-fixing portion 30, the side surfaces 33 being in the thickness direction or the side surface 32 in the lengthwise direction. The microsamples M fixed to the microsample-fixing portions 30 are analyzed using a transmission electron microscope (TEM), a scanning electron microscope (SEM), or an X-ray diffraction analyzer.

The microsample stage 1 includes multiple alignment marks 40. The alignment marks 40 are formed of the same material as the microsample-fixing portions 30. The alignment marks 40 are protrusions that protrude from the upper surfaces of the respective microsample-fixing portions 30. Although not illustrated, the contours of the alignment marks 40 are recognized by capturing images of the alignment marks 40 from above the microsample-fixing portions 30 using a camera or the like and performing an edge-extraction process on the captured images. After the contours of the alignment marks 40 are recognized, positions of microsamples to be attached to the microsample-fixing portions can be calculated. Although not illustrated, micro samples are transported using retention tools such as a probe and then attached to the calculated positions within the side surfaces of the microsample-fixing portions 30. Therefore, attachment of microsamples to the microsample stage 1 can be automated. Since the process of attaching microsamples to the microsample stage can be automatically performed, automation of analysis of microsamples is also accomplished. This increases work efficiency.

[Method of Manufacturing Microsample Stage]

With reference to FIGS. 2A to 20A and 2B to 20B, a method of manufacturing the microsample stage 1 according to Embodiment 1 will be described below.

First, a silicon member 50 having a length, thickness and height larger than those of the microsample stage 1 is prepared.

Figure 2A:
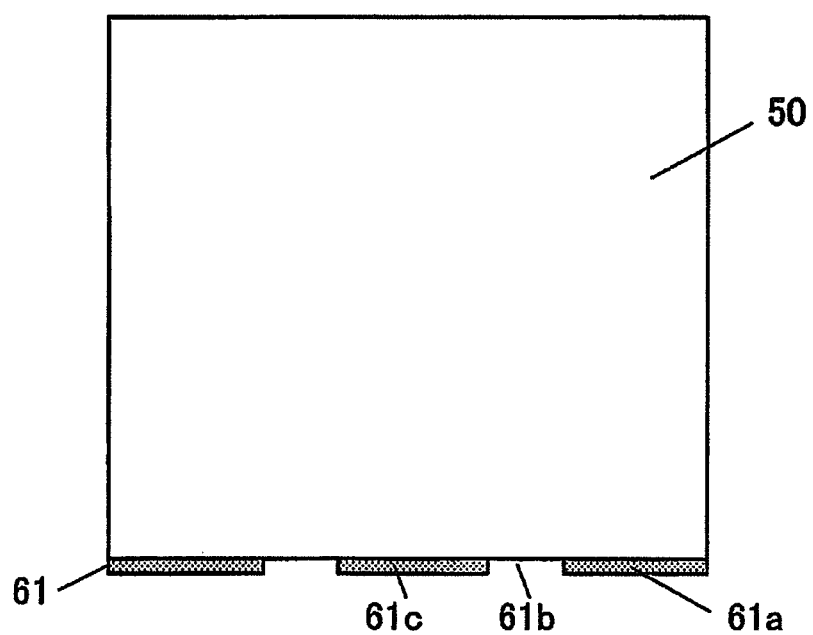
FIG. 2A is a cross-sectional view illustrating a silicon member in a process of manufacturing the microsample stage of FIG. 1.
Figure 2B:
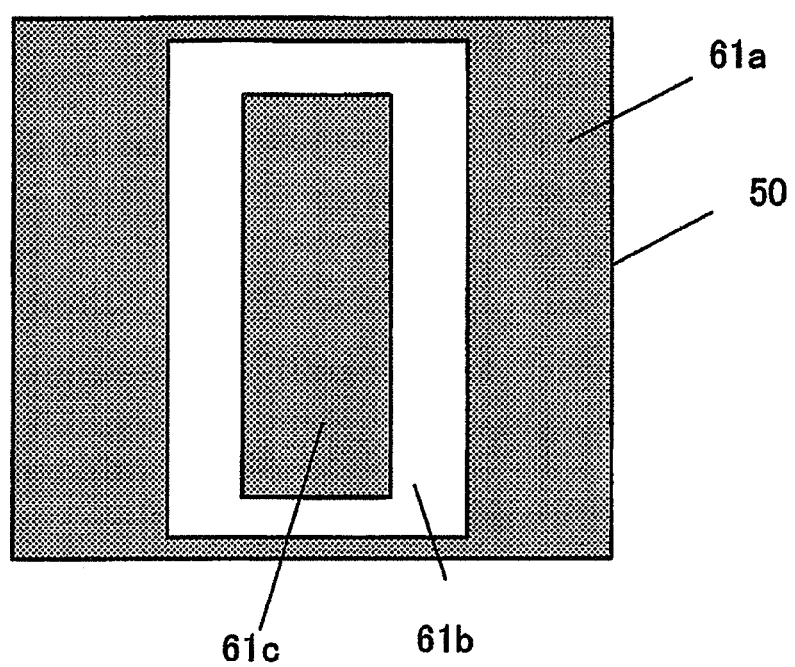
FIG. 2B is a bottom view corresponding to FIG. 2A.

As illustrated in FIGS. 2A and 2B, a photoresist pattern 61 is formed through a photolithography process. FIG. 2A is a cross-sectional view of the silicon member 50 and FIG. 2B is a bottom view corresponding to FIG. 2A. As well known, the photolithography process is a technology by which a photoresist pattern is formed by coating a photoresist layer on a surface, exposing the photoresist layer through an exposure mask, and developing the exposed photoresist layer.

The photoresist pattern 61 includes a periphery portion 61a, a rectangular opening 61b arranged inside the periphery portion 61a, and an island portion 61c arranged inside the frame-like opening 61b. Through the rectangular opening 61b, the bottom surface of the silicon member 50 is exposed. The island portion 61c has the same size and plane view shape as the base 10 of the microsample stage 1.

Figure 3A:
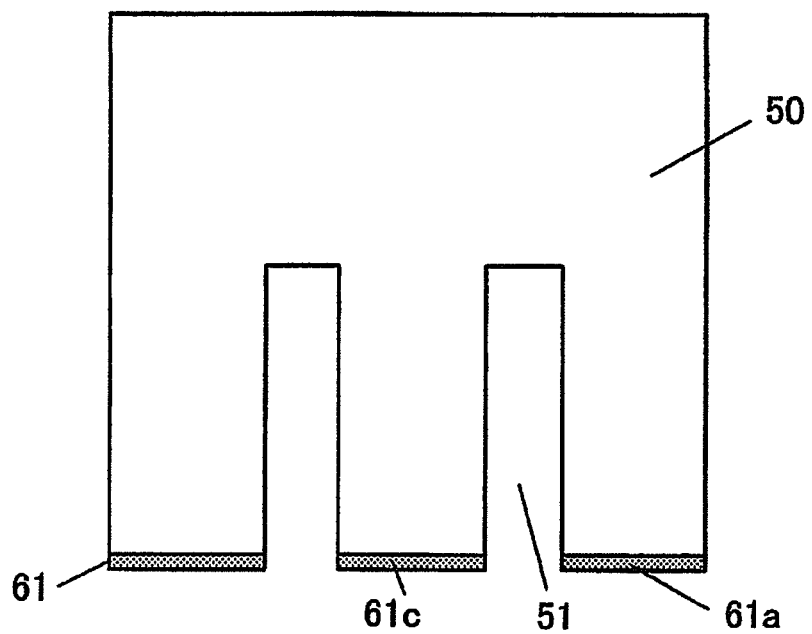
FIG. 3A is a cross-sectional view illustrating the silicon member in a process subsequent to FIG. 2A.
Figure 3B:
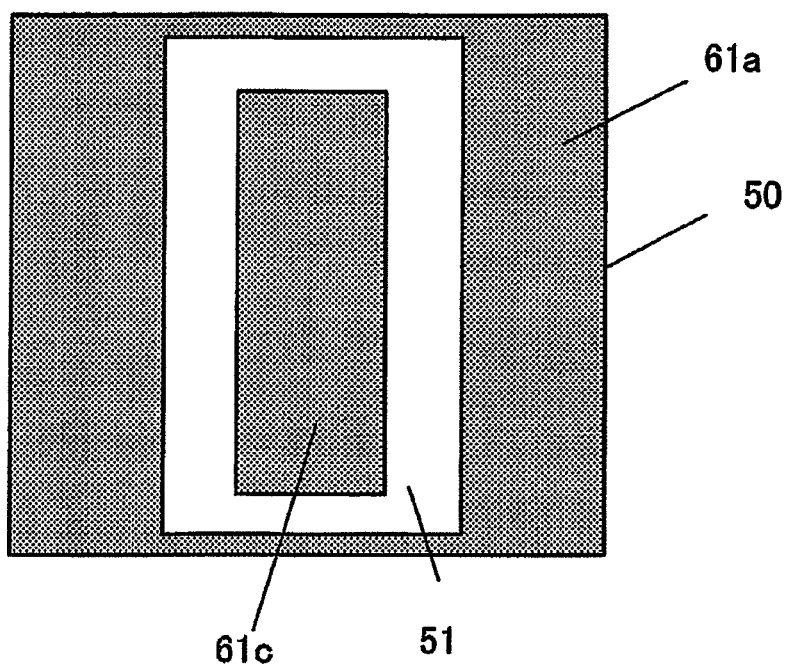
FIG. 3B is a bottom view corresponding to FIG. 3A.

FIG. 3A is a cross-sectional view of the silicon member 50 in a process subsequent to FIG. 2A and FIG. 3B is a bottom view corresponding to FIG. 3A.

Next, a dry etching process is performed to remove a portion of the silicon member 50, which is exposed through the opening 61b of the photoresist pattern 61. As a result, a frame-shaped recess 51 is formed in the bottom surface of the silicon member 50.

Figure 4A:
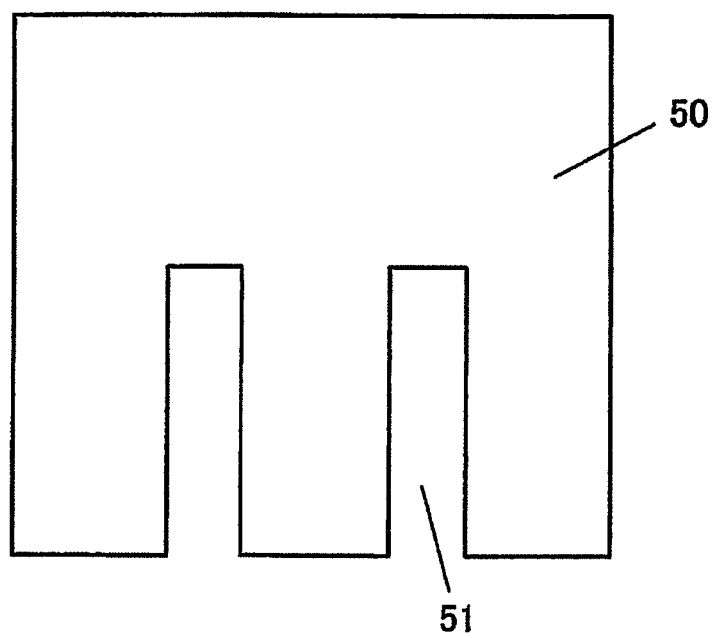
FIG. 4A is a cross-sectional view illustrating the silicon member in a process subsequent to FIG. 3A.
Figure 4B:
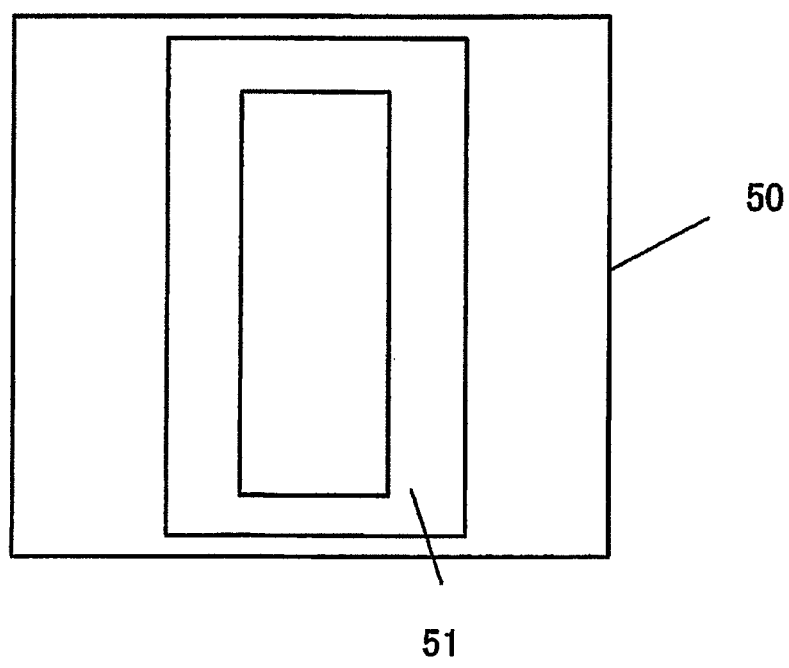
FIG. 4B is a bottom view corresponding to FIG. 4A.

FIG. 4A is a cross-sectional view illustrating the silicon member 50 in a process subsequent to FIG. 3A, and FIG. 4B is a bottom view corresponding to FIG. 4A.

Next, cleaning is performed to remove the remaining photoresist pattern 61 on the bottom surface of the silicon member 50.

Figure 5A:
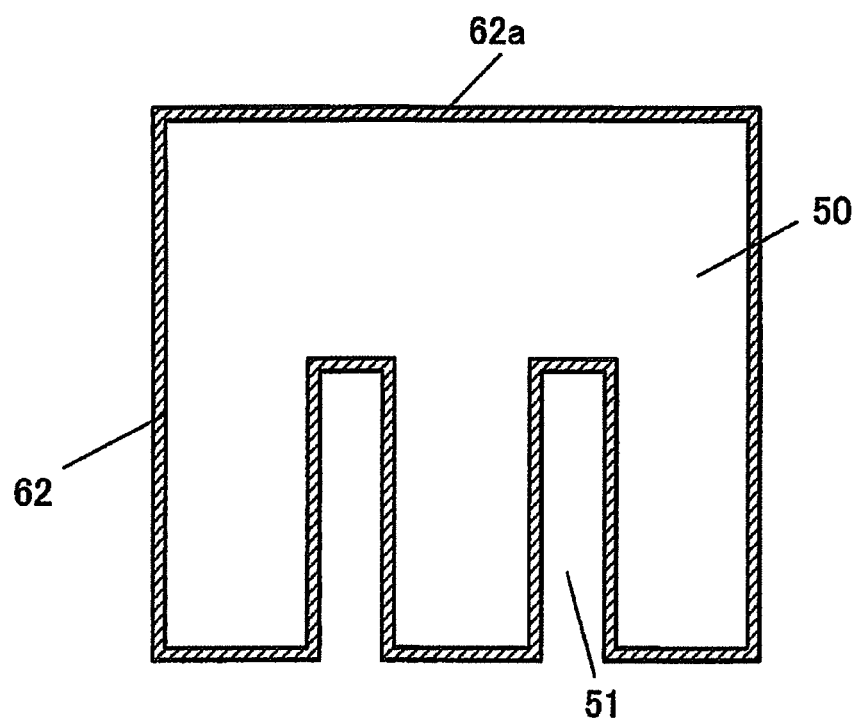
FIG. 5A is a cross-sectional view illustrating the silicon member in a process subsequent to FIG. 4A.
Figure 5B:
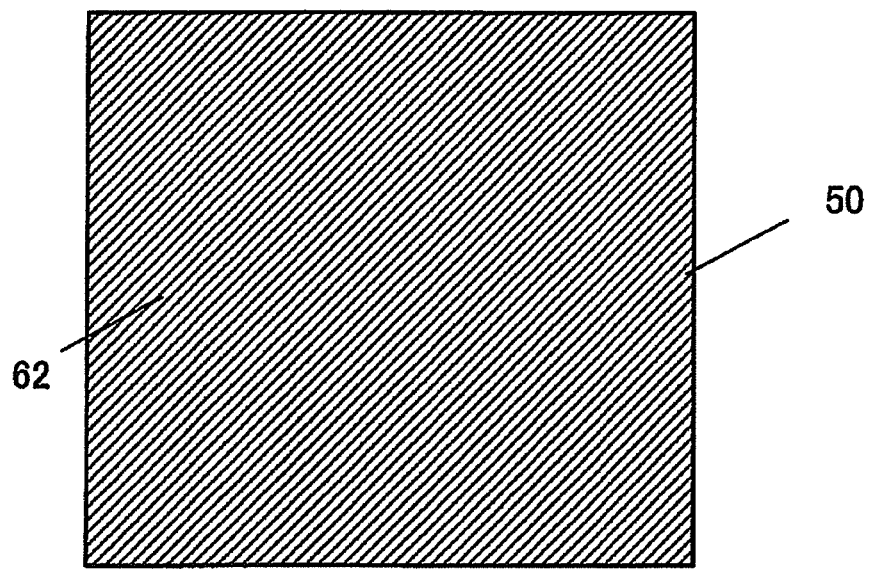
FIG. 5B is a top view corresponding to FIG. 5A.

FIG. 5A is a cross-sectional view illustrating the silicon member 50 in a process subsequent to FIG. 4A, and FIG. 5B is a top view corresponding to FIG. 5A.

Next, oxidation of the silicon member 50 is performed to form a protective insulation layer 62 on the entire surface of the silicon member 60. That is, the protective insulation layer 62 is formed by a silicon oxide.

Figure 6A:
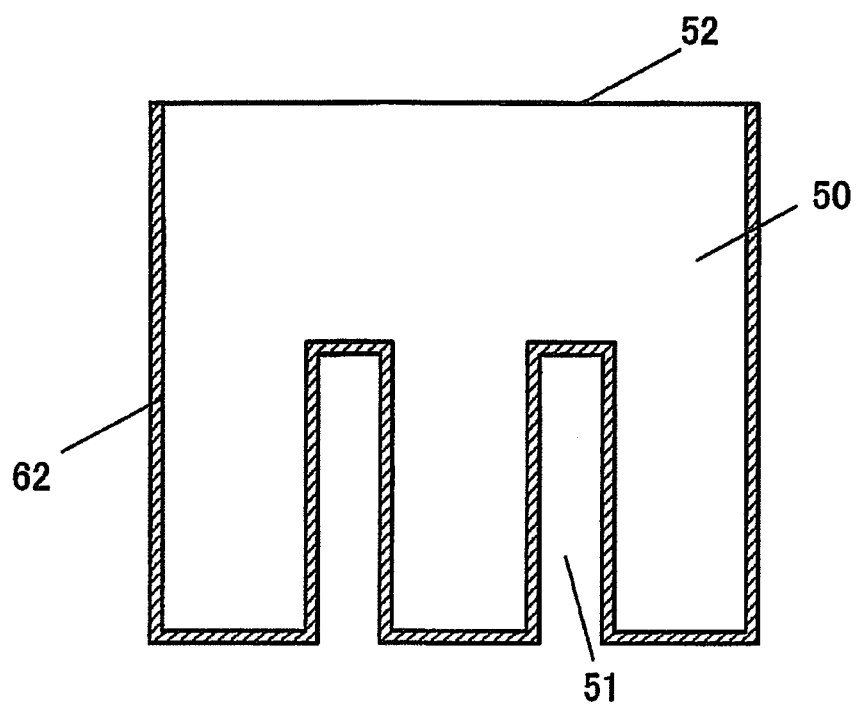
FIG. 6A is a cross-sectional view illustrating the silicon member in a process subsequent to FIG. 5A.
Figure 6B:
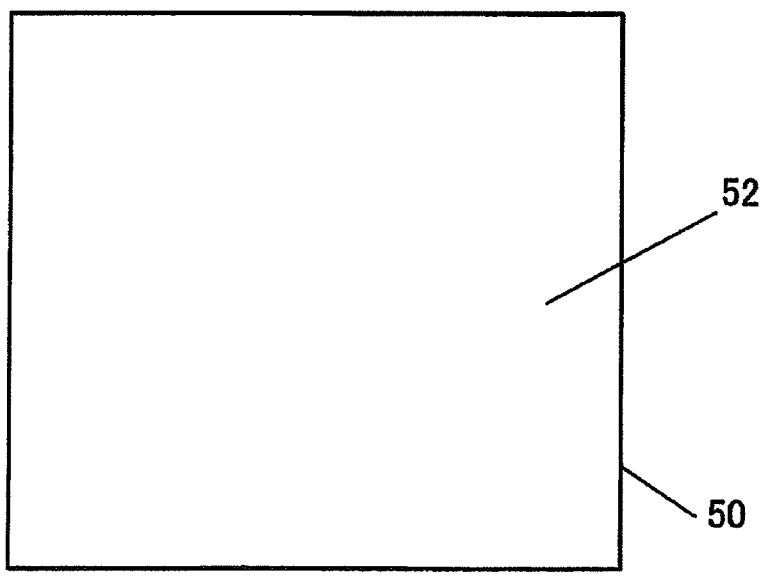
FIG. 6B is a top view corresponding to FIG. 6A.

FIG. 6A is a cross-sectional view illustrating the silicon member 50 in a process subsequent to FIG. 5A, and FIG. 6B is a top view corresponding to FIG. 6A.

A portion 62a (see FIG. 5A) of the protective insulation layer 62, formed on an upper surface 52 of the silicon member 50, is removed so that the upper surface 52 of the silicon member 50 is exposed. The removal of the portion 62a of the protective insulation layer 62 is performed through a dry etching process, for example. Alternatively, the portion 62a of the protective insulation layer 62 may be removed through a wet etching process.

Figure 7A:
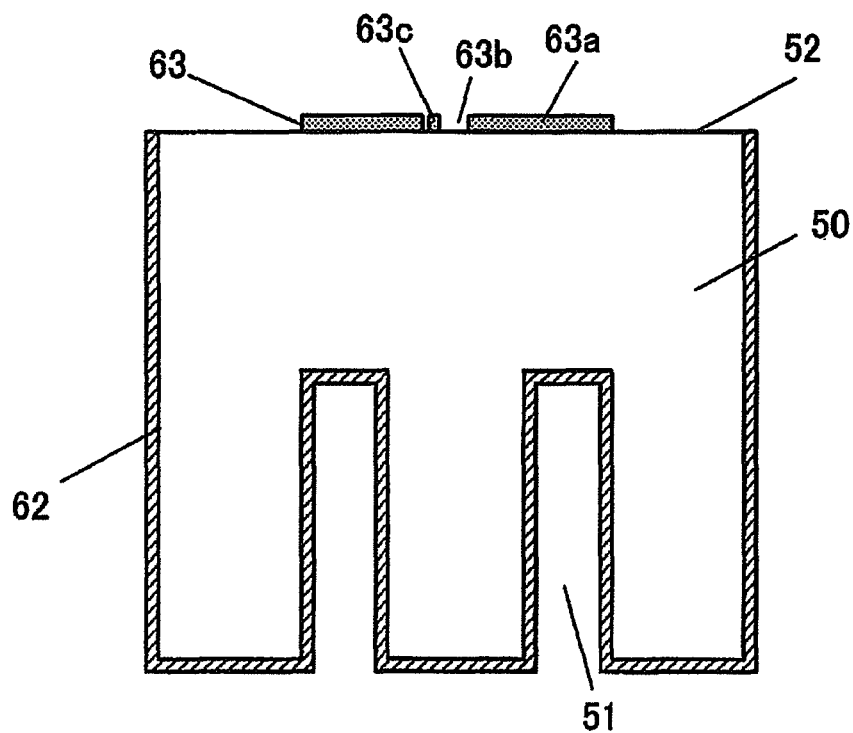
FIG. 7A is a cross-sectional view illustrating the silicon member in a process subsequent to FIG. 6A.
Figure 7B:
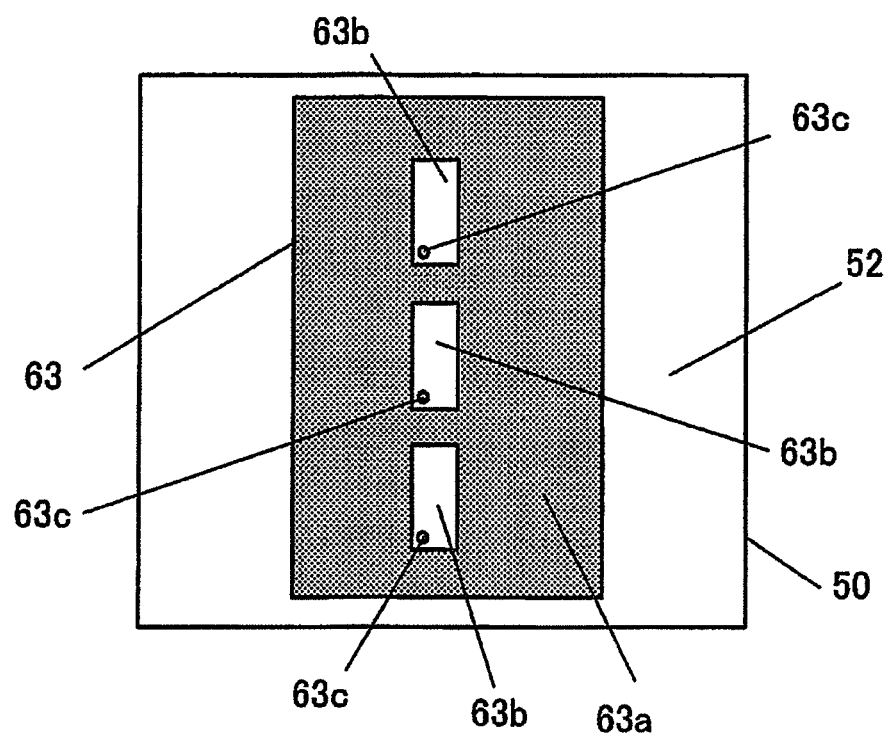
FIG. 7B is atop view corresponding to FIG. 7A.

FIG. 7A is a cross-sectional view illustrating the silicon member. 50 in a process subsequent to FIG. 6A and FIG. 7B is a top view corresponding to FIG. 7A.

A photoresist pattern 63 is formed on the exposed upper surface 52 of the silicon member 50 through, a photolithography process. The photoresist pattern 63 includes a rectangular pattern 63a, three rectangular openings 63b that are arranged in line at a middle portion of the rectangular pattern 63a, and three circular patterns 63c formed in the respective three rectangular openings 63b. The rectangular opening 63b has the same size and shape as the microsample-fixing portion 30 in terms of a plan view. The circular pattern 63c has the same size and shape as the alignment mark 40 in terms of a plan view.

Figure 8A:
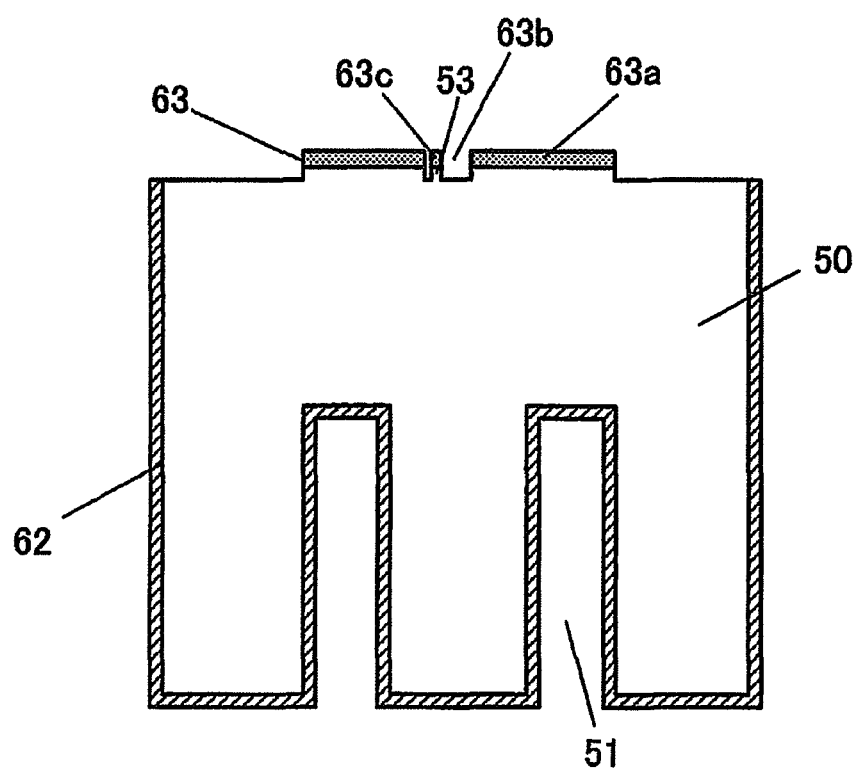
FIG. 8A is a cross-sectional view illustrating the silicon member in a process subsequent to FIG. 7A.
Figure 8B:
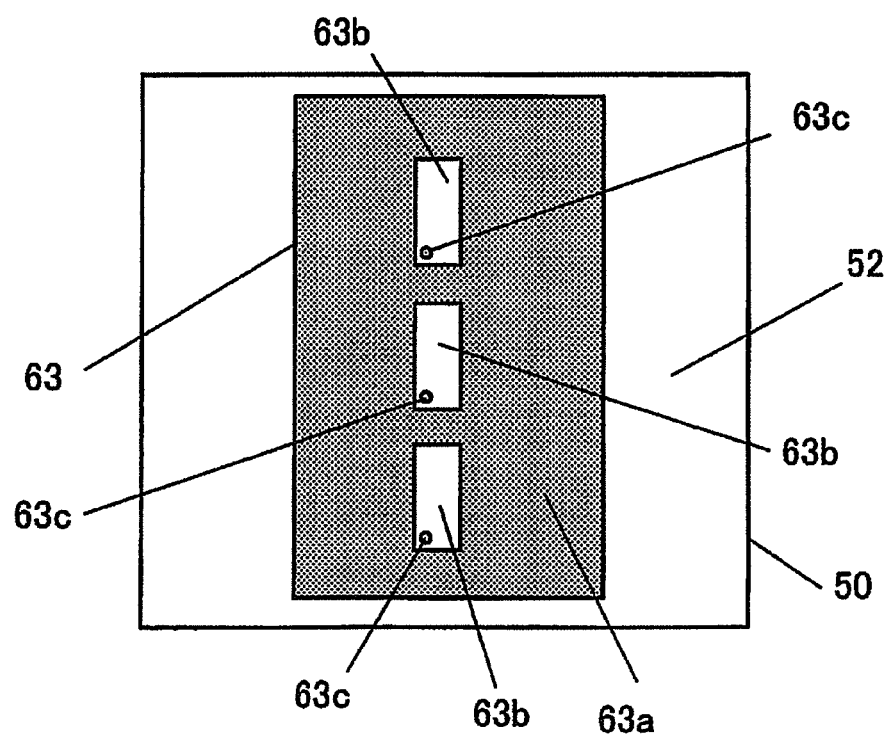
FIG. 8B is atop view corresponding to FIG. 8A.

FIG. 8A is a cross-sectional view illustrating the silicon member in a process subsequent to FIG. 7A, and FIG. 8B is a top view corresponding to FIG. 8A.

In this process, a dry etching process is performed to remove a portion of the upper surface 52 of the silicon member 50, the portion being exposed through the openings of the photoresist pattern 63. The etching depth in this process equals the height of the alignment mark 40. A protrusion 53 of the silicon member 50, which is to be formed under the circular pattern 63c of the photoresist pattern 63 in the following process, serves as the alignment mark 40 of the microsample stage 1.

Figure 9A:
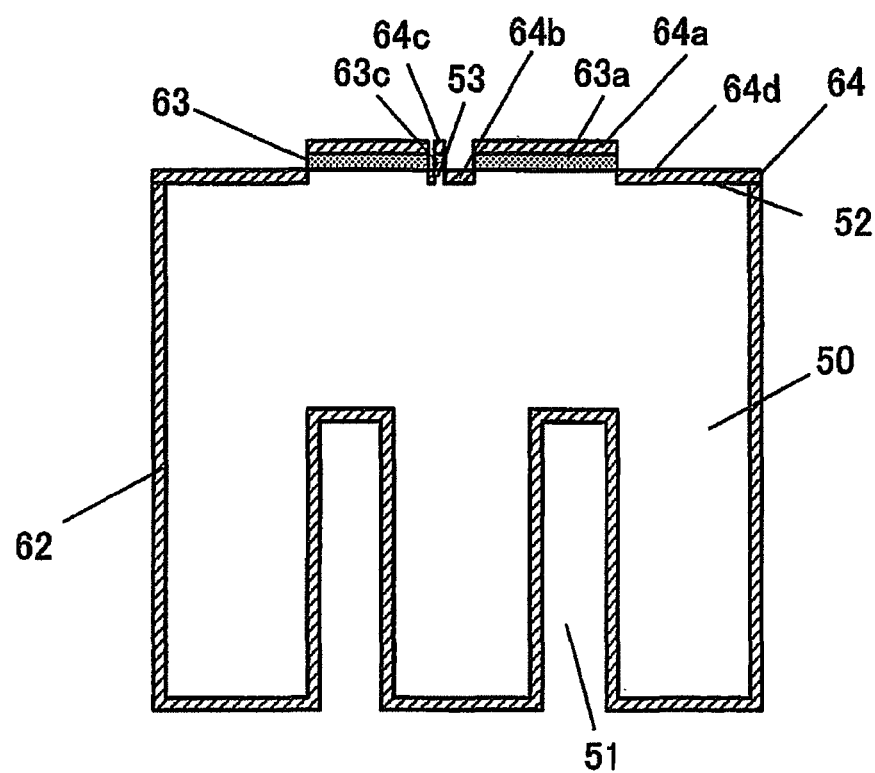
FIG. 9A is a cross-sectional view illustrating the silicon member in a process subsequent to FIG. 8A.
Figure 9B:
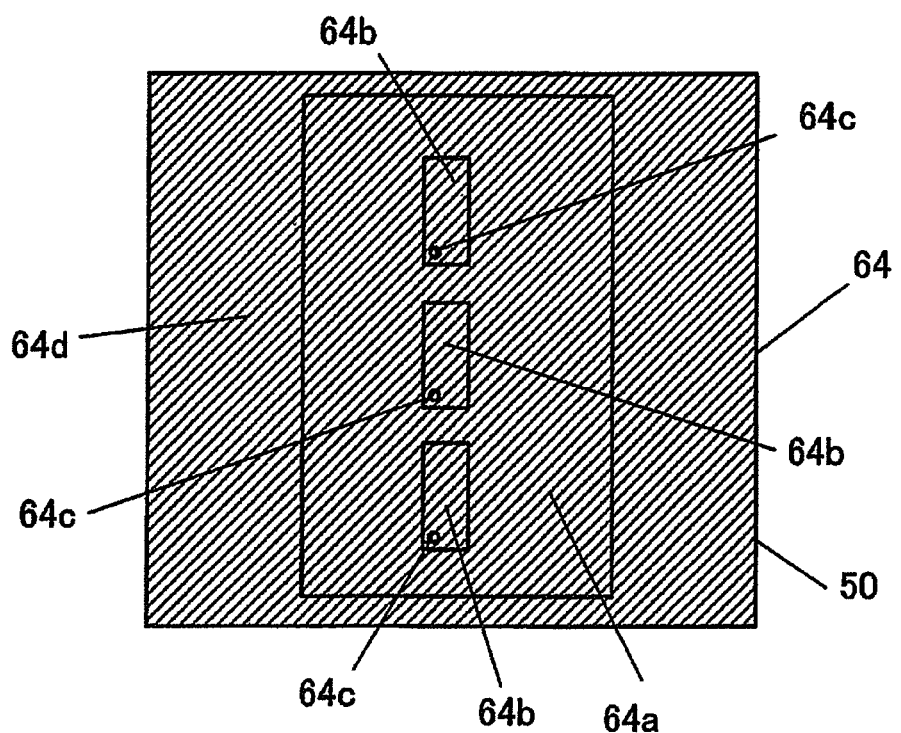
FIG. 9B is a top view corresponding to FIG. 9A.

FIG. 9A is a cross-sectional view illustrating the silicon member in a process subsequent to FIG. 8A, and FIG. 9B is a top view corresponding to FIG. 9A.

A mark-forming insulation layer 64 is formed on the entire upper surface of the silicon member 50 on which the photoresist pattern 63 is formed. The mark-forming insulation layer 64 is formed of a silicon oxide layer through a sputtering process, for example. The mark-forming insulation layer 64 includes a portion 64a that has a rectangular shape and is formed on the rectangular pattern 63a, three portions 64c formed on the respective circular patterns 63c, and three portions 64b that have a rectangular shape and are formed inside the respective three rectangular openings 63b, and a portion 64d that is a periphery portion formed outside the rectangular pattern 63a. As described above, the shape and size of the rectangular openings 63b of the photoresist pattern 63 in a plan view are the same as those of the microsample-fixing portions 30. The shape and size of each portion 64b of the mark-forming insulation layer 64 are the same as those of each microsample-fixing portion 30 in terms of a plan view.

Figure 10A:
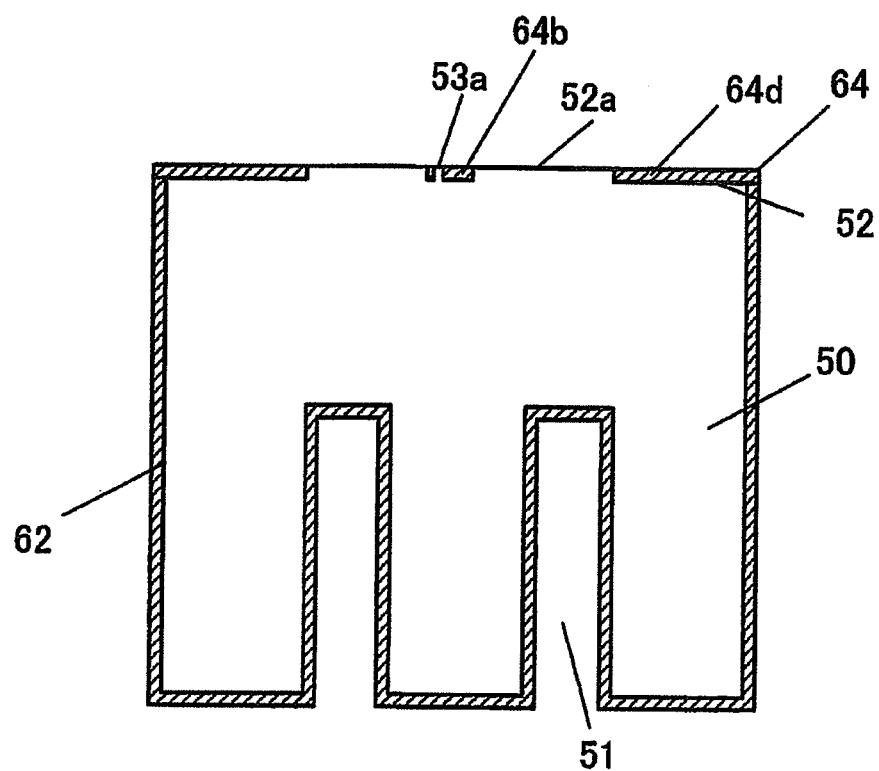
FIG. 10A is a cross-sectional view illustrating the silicon member in a process subsequent to FIG. 9A.
Figure 10B:
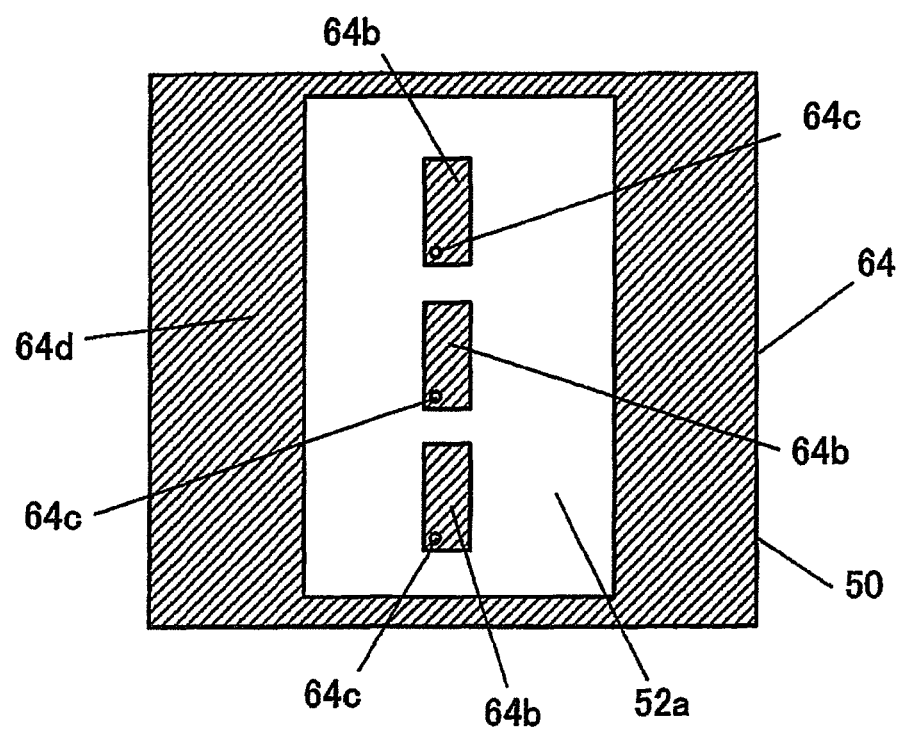
FIG. 10B is a top view corresponding to FIG. 10A.

FIG. 10A is a cross-sectional view illustrating the silicon member in a process subsequent to FIG. 9A, and FIG. 10B is a top view corresponding to FIG. 10A.

A lift-off process is performed to remove the remaining portions 64a and 64c of the mark-forming insulation layer 64 from the upper surface 52 of the silicon member 50 as well as the photoresist pattern 63. Through this process, some portions of the upper surface of the silicon member 50 (i.e., a portion 52a disposed under the rectangular pattern 63a and a portion 53a disposed under the circular pattern 63c) are exposed. However, some portions 64b and 64d of the mark-forming insulation layer 64 still remain on the upper surface 52 of the silicon member 50.

Figure 11A:
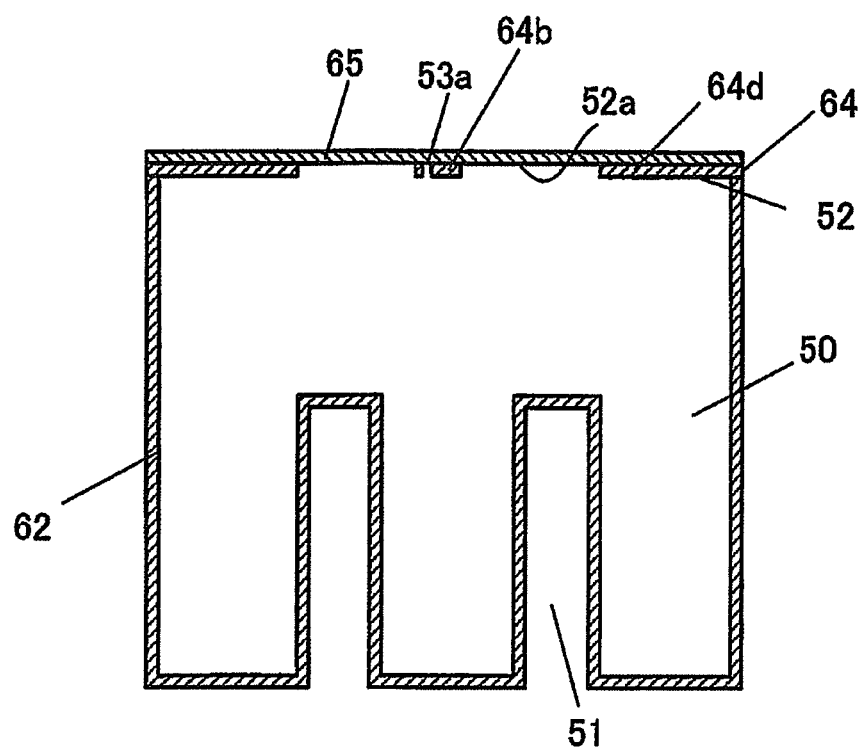
FIG. 11A is a cross-sectional view illustrating the silicon member in a process subsequent to FIG. 10A.
Figure 11B:
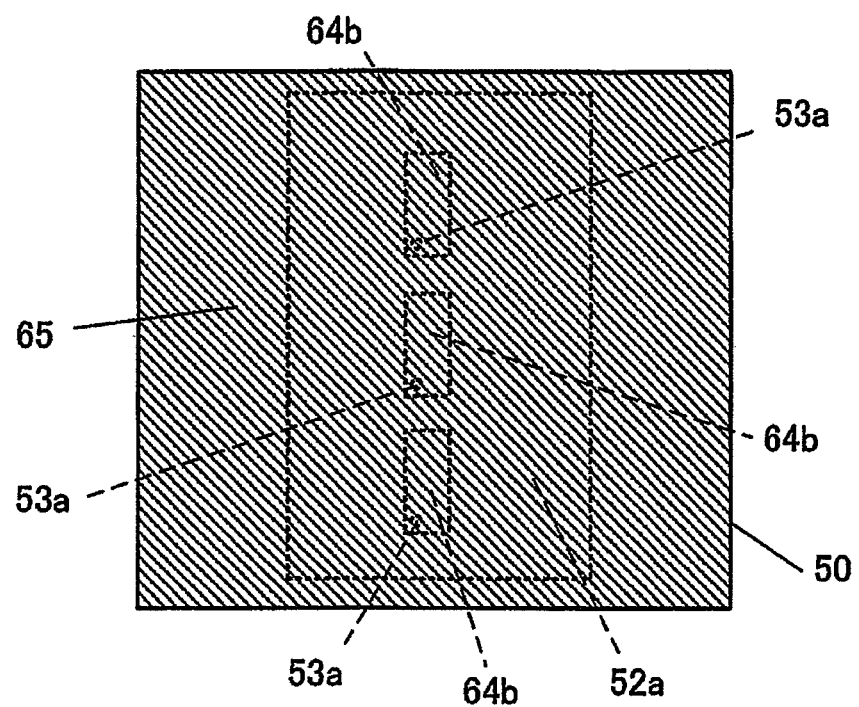
FIG. 11B is a top view corresponding to FIG. 11A.

FIG. 11A is a cross-sectional view illustrating the silicon member in a process subsequent to FIG. 10A, and FIG. 11B is a top view corresponding to FIG. 11A.

A metal layer 65 such as an aluminum layer is formed on the entire upper surface 52 of the silicon member 50 through a sputtering process or the like. As a result, some portions 64b and 64d of the mark-forming insulation layer 64, formed on the upper surface 52 of the silicon member 50, and some portions 52a and 53a of the upper surface 52 of the silicon member 50 are covered by the metal layer 65.

Figure 12A:
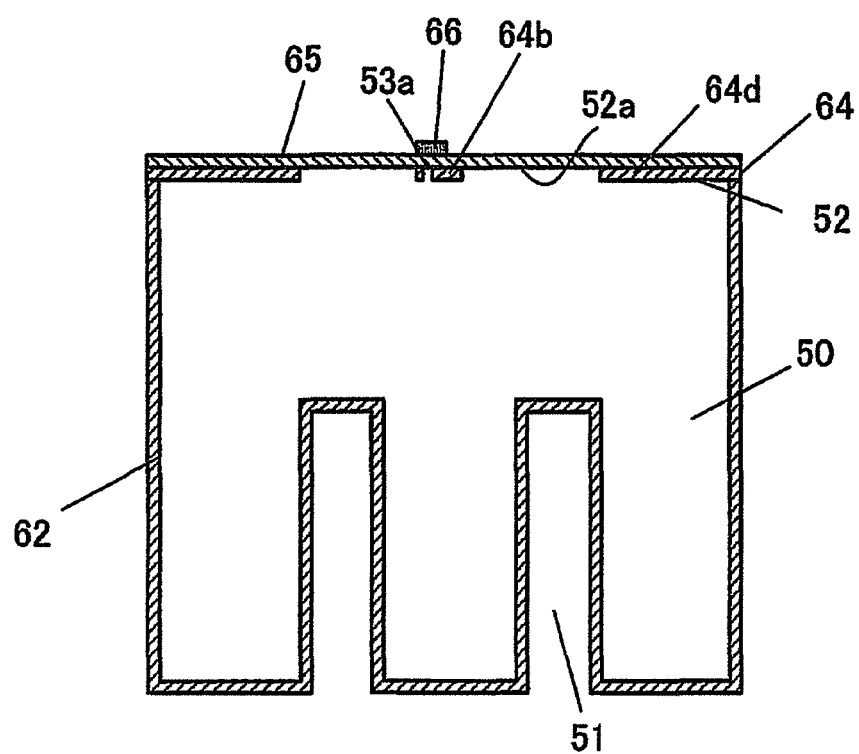
FIG. 12A is a cross-sectional view illustrating the silicon member in a process subsequent to FIG. 11A.
Figure 12B:
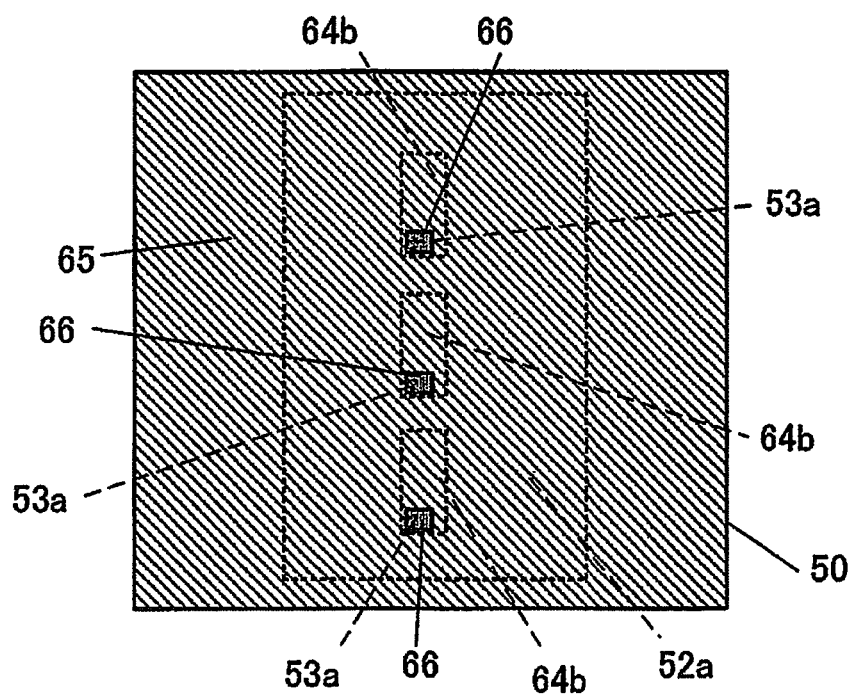
FIG. 12B is a top view corresponding to FIG. 12A.

FIG. 12A is a cross-sectional view illustrating the silicon member in a process subsequent to FIG. 11A, and FIG. 12B is a top view corresponding to FIG. 12A.

Three photoresist patterns 66 are formed on the metal layer 65 through a photolithography process. Each photoresist pattern 66 is formed to have a size that can cover the portion 53a of the upper surface 52 of the silicon member 50 and surrounding portions.

Figure 13A:
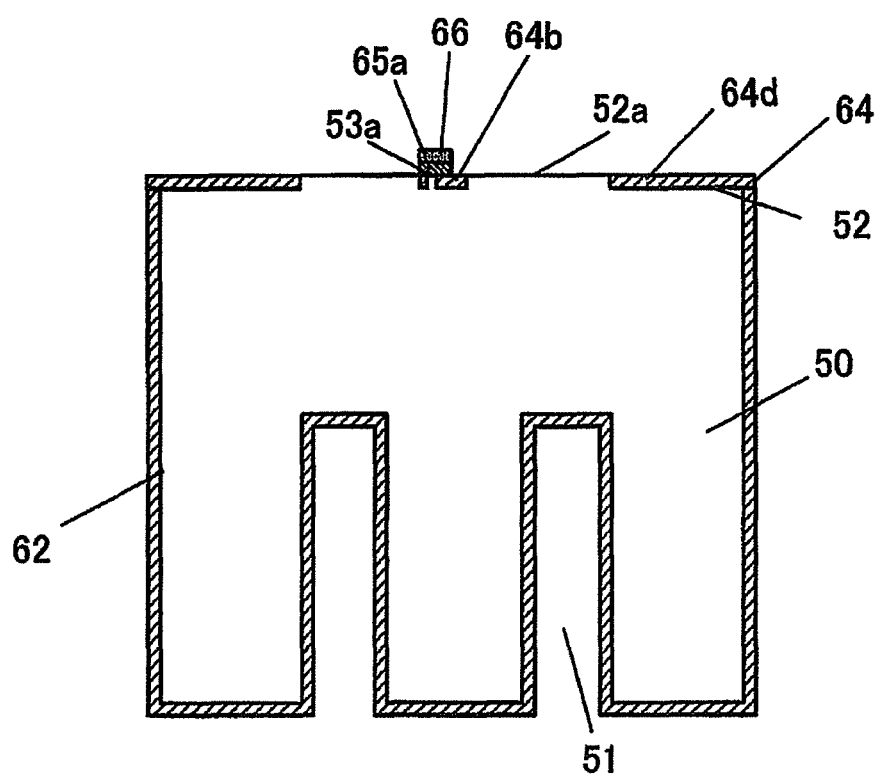
FIG. 13A is a cross-sectional view illustrating the silicon member in a process subsequent to FIG. 12A.
Figure 13B:
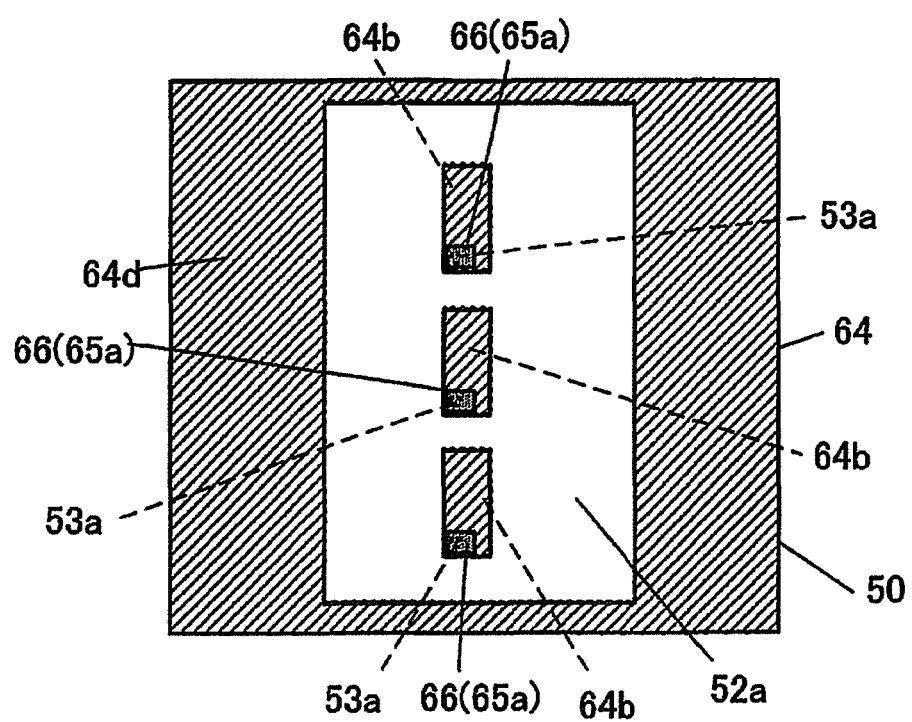
FIG. 13B is a top view corresponding to FIG. 13A.
Figure 14A:
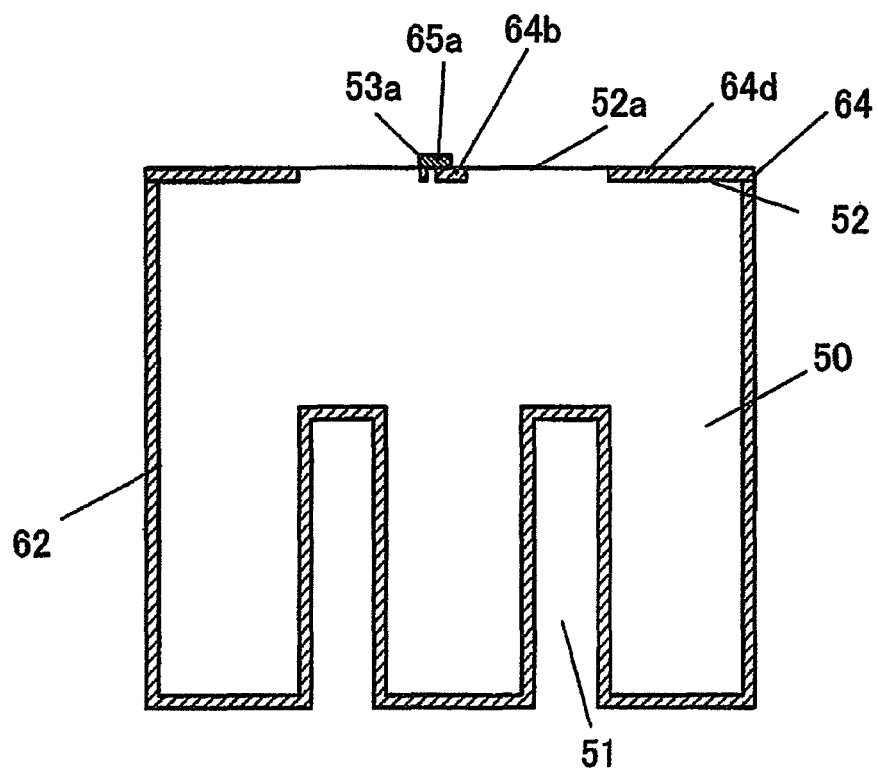
FIG. 14A is a cross-sectional view illustrating the silicon member in a process subsequent to FIG. 13A.
Figure 14B:
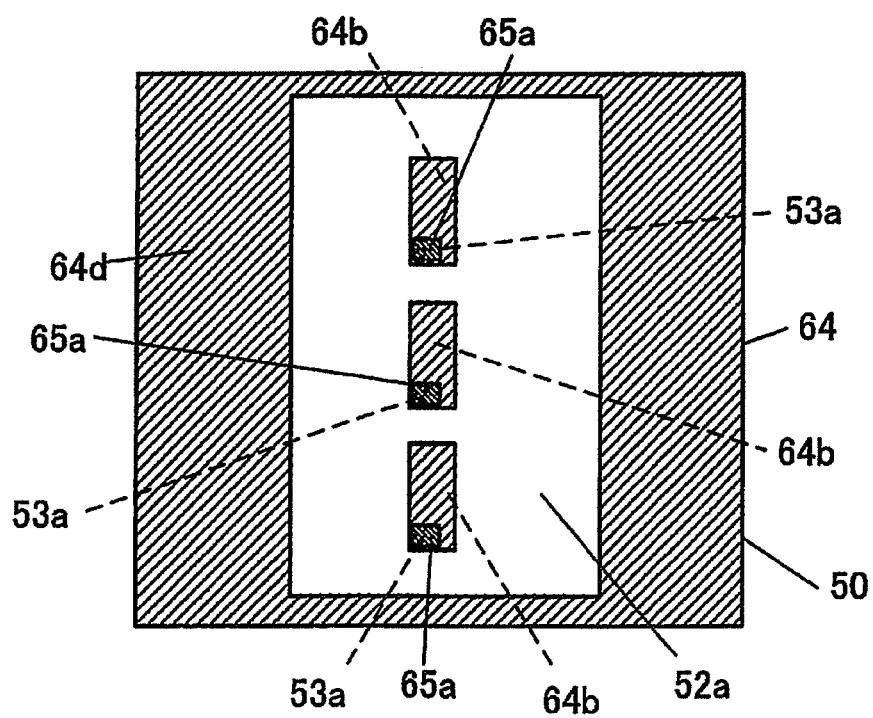
FIG. 14B is a top view corresponding to FIG. 14A.

FIG. 13A is a cross-sectional view illustrating the silicon member in a process subsequent to FIG. 12A, and FIG. 14B is a top view corresponding to FIG. 13A.

The metal layer 65 is etched using the three photoresist patterns 66 as an etching mask. As a result, only portions 65a of the metal layer 65, formed under the photoresist pattern 66, remain and the portion 52a of the upper surface 52 of the silicon member 50 is exposed. However, other portions of the upper surface 52 of the silicon member 50 (i.e., the portions 53a and the surrounding portions thereof, which correspond to three patterns of the remaining metal layer 65), are still covered by the metal layer 65 and the photoresist pattern 66.

FIG. 14A is a cross-sectional view illustrating the silicon member in a process subsequent to FIG. 13A, and FIG. 14B is a top view corresponding to FIG. 14A.

The three photoresist patterns 66 are removed.

Figure 15A:
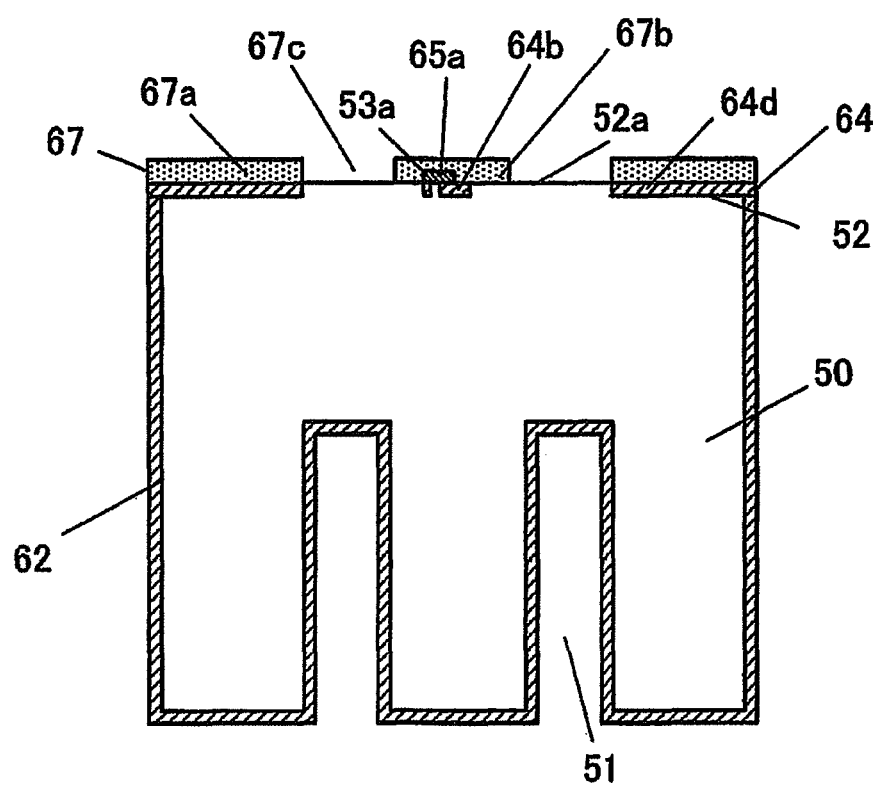
FIG. 15A is a cross-sectional view illustrating the silicon member in a process subsequent to FIG. 14A.
Figure 15B:
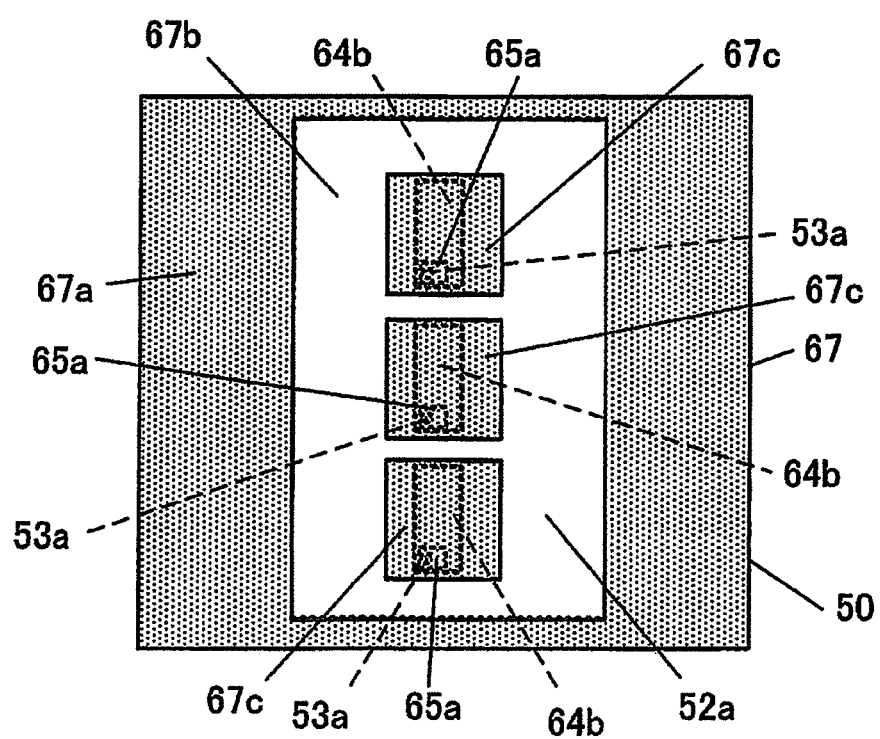
FIG. 15B is a top view corresponding to FIG. 15A.

FIG. 15A is a cross-sectional view illustrating the silicon member in a process subsequent to FIG. 14A, and FIG. 15B is a top view corresponding to FIG. 15A.

A photoresist pattern 67 is formed on the upper surface 52 of the silicon member 50 on which a portion 65a of the metal layer 65 remains, through a photolithography process.

The photoresist pattern 67 includes a rectangular periphery pattern 67a, an opening 67b that is formed in a center portion of the periphery pattern 67a, and three island patterns 67c disposed within the opening 67b. Each island pattern 67c covers a portion 65a of the metal layer 65, the rectangular portion 64b of the mark-forming insulation layer 64, and surrounding portions thereof. The shape and size of each island pattern 67c in a plan view are the same as those of the middle support 20 of the micro sample stage 1.

Figure 16A:
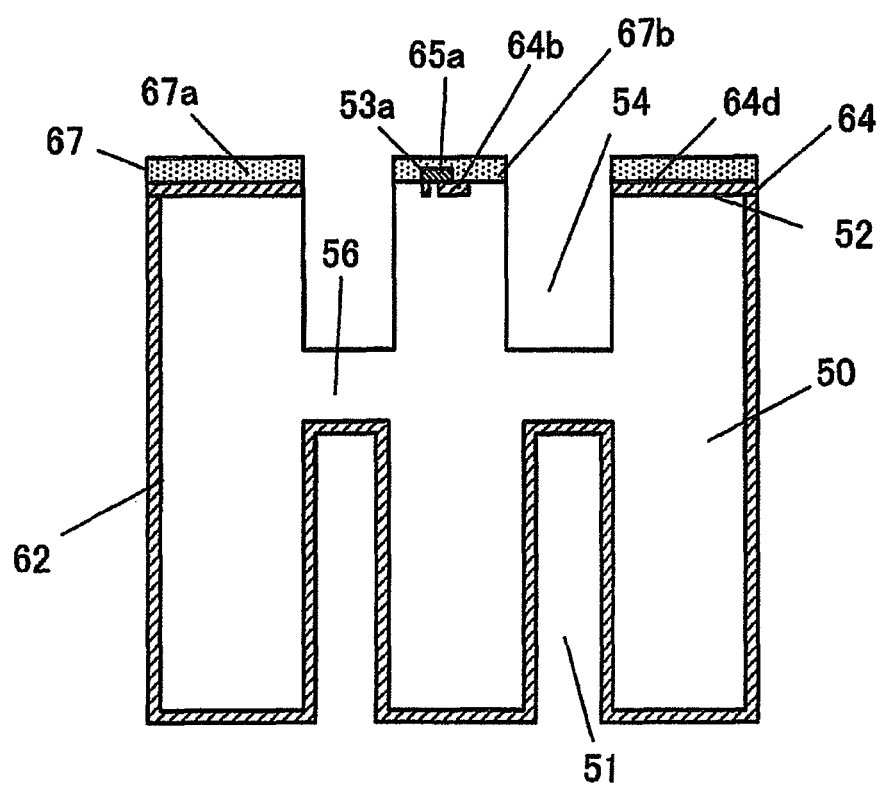
FIG. 16A is a cross-sectional view illustrating the silicon member in a process subsequent to FIG. 15A.
Figure 16B:
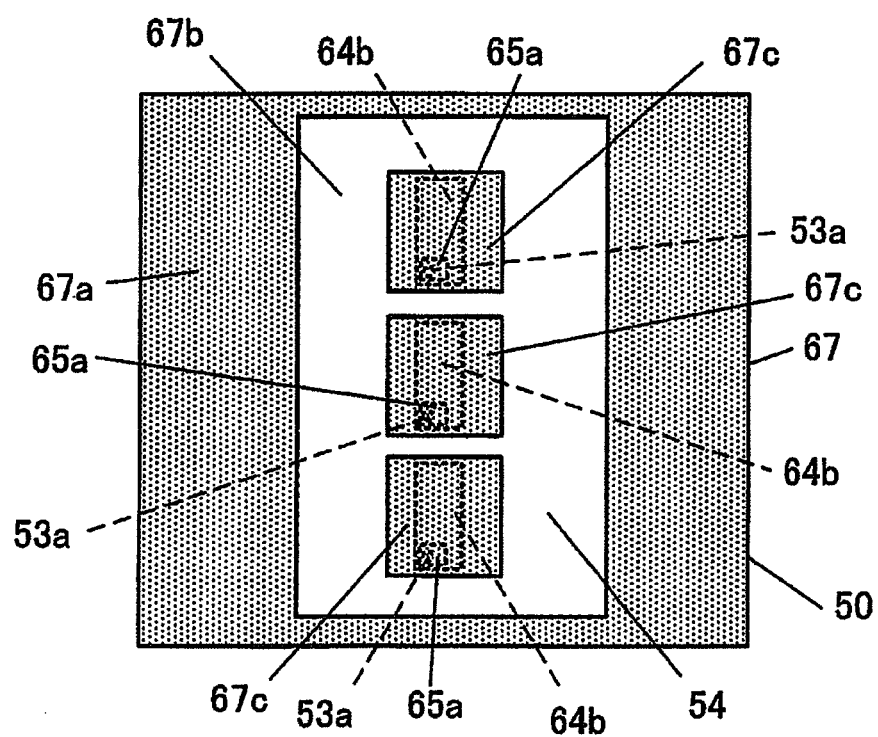
FIG. 16B is a top view corresponding to FIG. 16A.

FIG. 16A is a cross-sectional view illustrating the silicon member in a process subsequent to FIG. 15A, and FIG. 16B is a top view corresponding to FIG. 16A.

A dry etching process is performed to remove the portion 52a of the upper surface 52 of the silicon member 50, using the photoresist pattern 67 as an etching mask. Through this dry etching process, a frame-shaped recess 54 is formed in the silicon member 50. The depth of the recess 54 is greater than the height of the microsample-fixing portion 30. The depth of the recess 54 is controlled in the dry etching process such that the bottom of the recess 54 does not reach the bottom of the recess 51. That is, the dry etching process is performed such that a barrier portion 56 exists between the bottom of the recess 54 and the bottom of the recess 51.

Figure 17A:
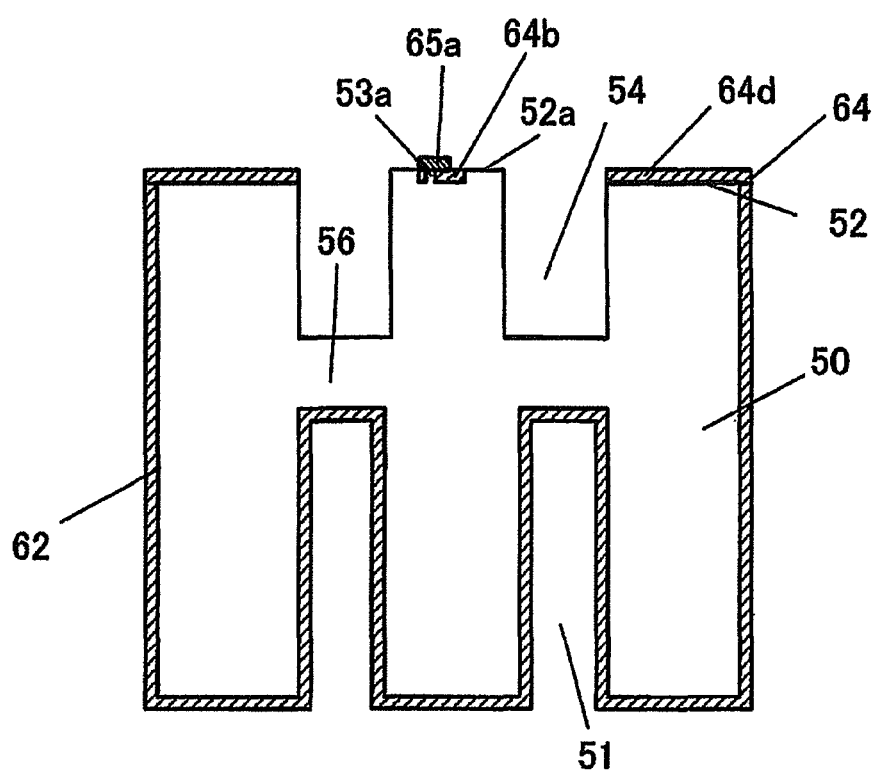
FIG. 17A is a cross-sectional view illustrating the silicon member in a process subsequent to FIG. 16A.
Figure 17B:
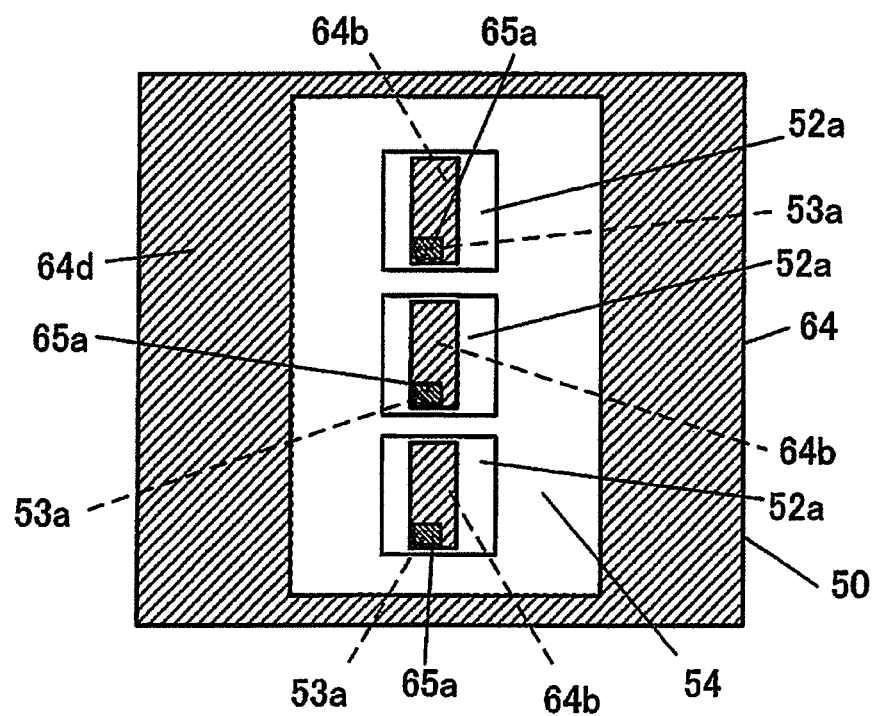
FIG. 17B is a top view corresponding to FIG. 17A.

FIG. 17A is a cross-sectional view illustrating the silicon member in a process subsequent to FIG. 16A, and FIG. 17B is a top view corresponding to FIG. 17A.

The photoresist pattern 67 is removed to expose the periphery portion 64d of the mark-forming insulation layer 64 and the portion 65a of the metal layer 65.

Figure 18A:
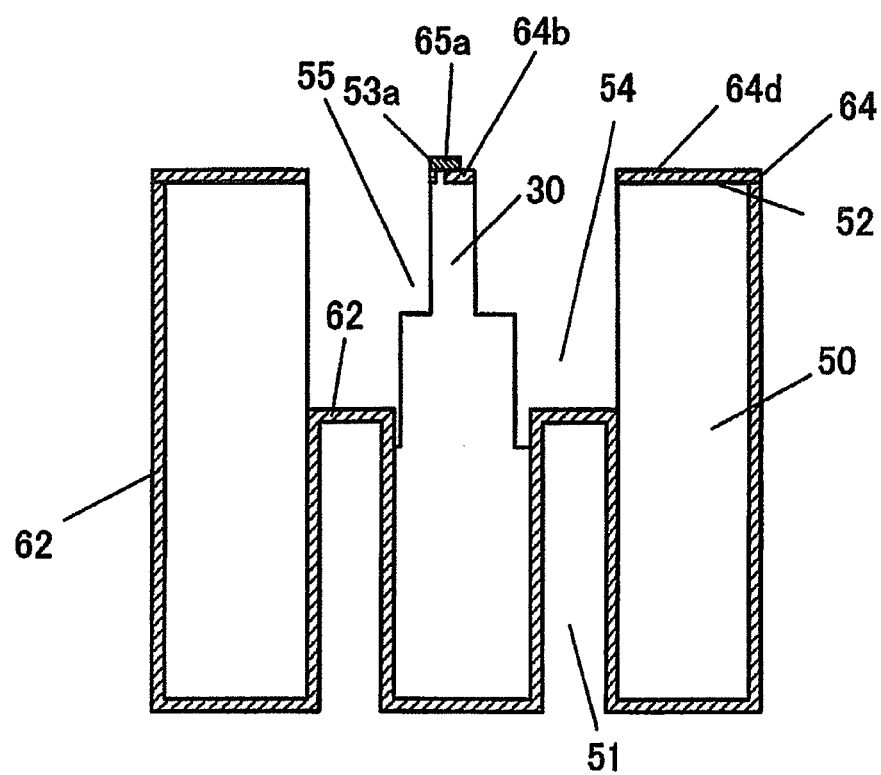
FIG. 18A is a cross-sectional view illustrating the silicon member in a process subsequent to FIG. 17A.
Figure 18B:
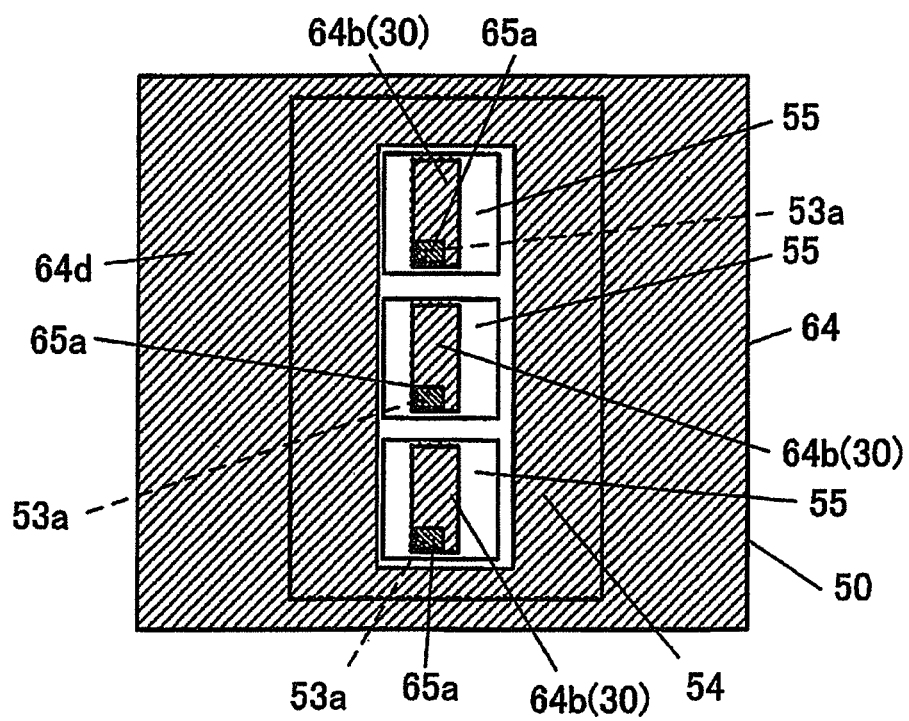
FIG. 18B is a top view corresponding to FIG. 18A.

FIG. 18A is a cross-sectional view illustrating the silicon member in a process subsequent to FIG. 17A, and FIG. 18B is a top view corresponding to FIG. 18A.

The portion 52a of the upper surface 52 of the silicon member 50 is etched through a dry etching process, using the periphery portion 64d of the mark-forming insulation layer 64, the portion 65a of the metal layer 65, and the rectangular portion 64b of the mark-forming insulation layer 64 as an etching mask. As a result, an inner recess 55 is formed within the recess 54. The shape and size of the rectangular portion 64b of the mark-forming insulation layer 64 are the same as those of the microsample-fixing portion 30 in terms of a plan view. Therefore, three microsample-fixing portions 30 are formed within the inner recess 55 of the silicon member 50. The barrier portion 56 disposed between the recess 54 and the inner recess 51 of the silicon member 50 is also removed in a thickness direction, through a dry etching process. As a result, only the protective insulation layer 62 remains between the recess 54 and the recess 51. The depth of the inner recess 55 equals the height of the microsample-fixing portion 30. At this point, since the upper surface of the protrusion 53 of the silicon member 50 is covered by the portion 65a of the metal layer 65, the protrusion 53 of the silicon member 50 is not etched off when the portion 52a of the upper surface 52 of the silicon member 50 undergoes a dry etching process.

Figure 19A:
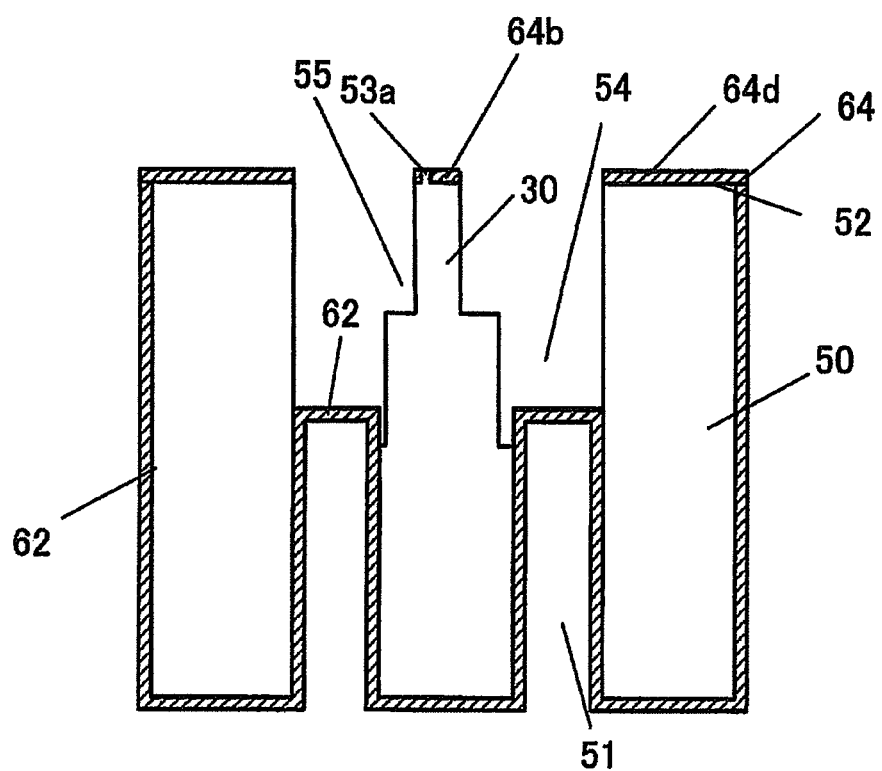
FIG. 19A is a cross-sectional view illustrating the silicon member in a process subsequent to FIG. 18A.
Figure 19B:
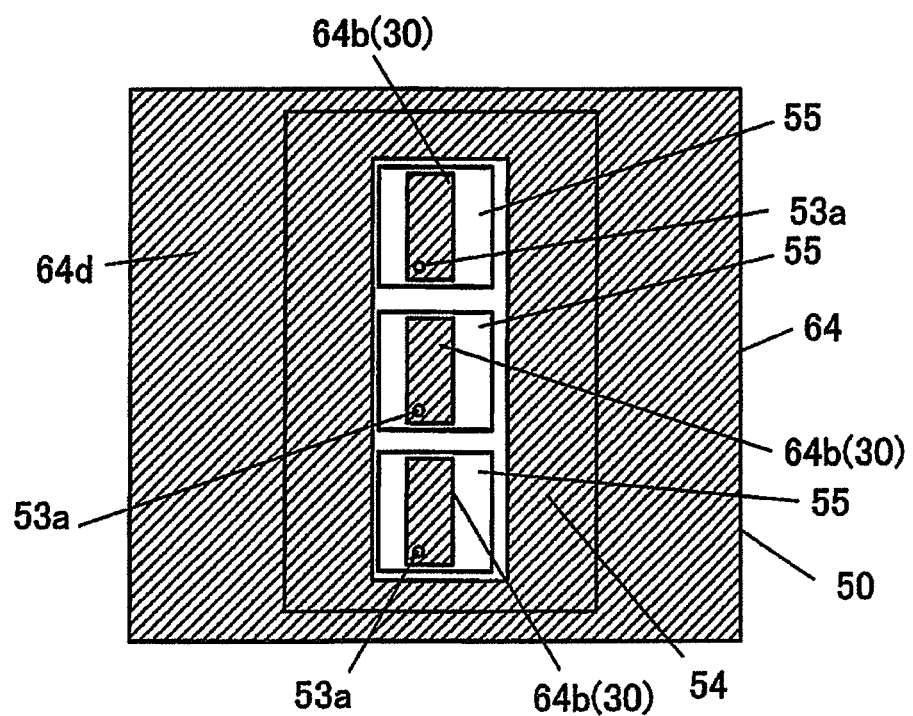
FIG. 19B is a top view corresponding to FIG. 19A.

FIG. 19A is a cross-sectional view illustrating the silicon member in a process subsequent to FIG. 18A, and FIG. 19B is a top view corresponding to FIG. 19A.

The portion 65a of the metal layer 65, formed on the portion 52a of the upper surface 52 of the silicon member 50, is etched off. Through this process, a portion 53a of the upper surface 52 of the silicon member 50 is exposed.

Figure 20A:
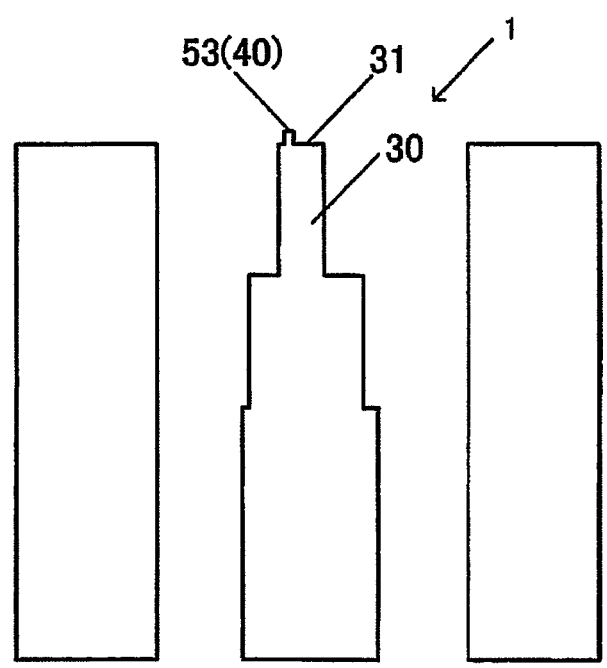
FIG. 20A is a cross-sectional view illustrating the silicon member in a process subsequent to FIG. 19A.
Figure 20B:
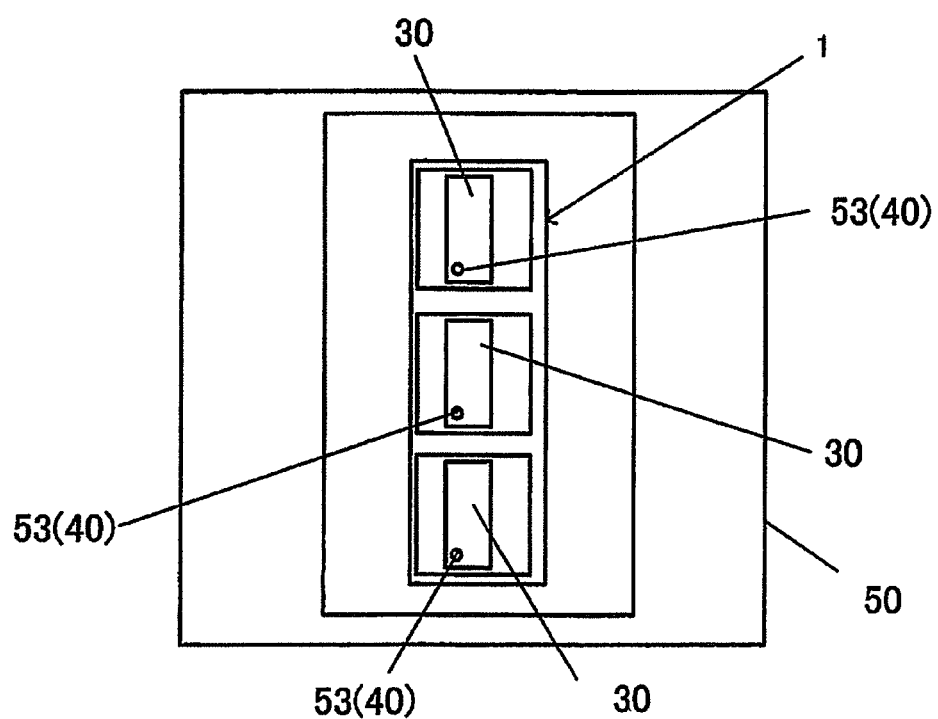
FIG. 20B is a top view corresponding to FIG. 20A.

FIG. 20A is a cross-sectional view illustrating the silicon member in a process subsequent to FIG. 19A, and FIG. 20B is a bottom view corresponding to FIG. 20A.

A wet etching process is performed to remove the mark-forming insulation layer 64 and the protective insulation layer 62 that are formed on the surface of the silicon member 50. Since the mark-forming insulation layer 64 and the protective insulation layer 62 are formed of a silicon oxide, all of the portions 64c and 64d of the mark-forming insulation layer 64 and the protective insulation layer 62 are entirely removed when a wet etching process to remove a silicon oxide is performed. Since the portions 64c and 64d of the mark-forming insulation layer 64 are removed, the protrusion 53 serving as the alignment mark 40 is formed on the upper surface 31 of the microsample-fixing portion 30. In addition, since the protective insulation layer 62 is removed, a center portion of the silicon member 50 is isolated from the periphery portion, and thus the microsample stage 1 shown in FIG. 1 is finally formed.

According to Embodiment 1 that has been described so far, the following advantages can be obtained.

First, the microsample stage 1 includes the base 10, the microsample-fixing portion 30 to which a microsample is fixed, and the multiple alignment marks 40. Accordingly, it is possible to position microsamples at predetermined positions of the microsample-fixing portion 30 by capturing images of the alignment marks 40 using an image capturing device such as a camera and detecting a position of the microsample-fixing portion 30 through predetermined calculations. This enables automatization of attachment of microsamples to the microsample stage 1, resulting in an increase in work efficiency.

Second, the microsample stage 1 is formed such that the base 10, the microsample-fixing portion 30, and the multiple alignment marks 40 are formed of the same material and integrated as a single body. Therefore, it is possible to rapidly form the multiple alignment marks 40, for example, using an etching process. Therefore, manufacturing efficiency of the microsample stage 1 is increased.

Third, when the microsample stage 1 is formed of a silicon member, the elements of the microsample stage 1 can be precisely formed.

Fourth, multiple microsample-fixing portions 30 are formed on the base and multiple alignment marks 40 are provided to the respective microsample-fixing portions 30. Therefore, a microsample can be attached in the vicinity of the alignment mark 40. That is, positioning alignment for attachment of microsamples is facilitated. For this reason, precision in positioning alignment is increased.

Fifth, since the alignment marks 40 are formed on the upper surfaces 31 of the microsample-fixing portions 30, it is easy to capture images of the alignment marks 40. In addition, since the alignment marks 40 are not arranged at center portions of the microsample-fixing portions but arranged in periphery portions of the microsample-fixing portions, when microsamples are fixed to the upper surfaces 31 of the microsample-fixing portions 30, the alignment marks 40 do not serve as obstructions and do not interfere with attachment of microsamples.

Sixth, since the alignment marks 40 are formed as protrusions 63 that protrude from the upper surfaces 31 of the microsample-fixing portions 30, although all the elements of the microsample stage 1 are formed of the same material, it is possible to capture images of the alignment marks 40 and recognize the contours of the alignment marks 40 through edge-extraction processing.

Embodiment 2

[Structure of Microsample Stage]

A microsample stage according to Embodiment 2 will be described below, with respect to the accompanying drawings.

Figure 21:
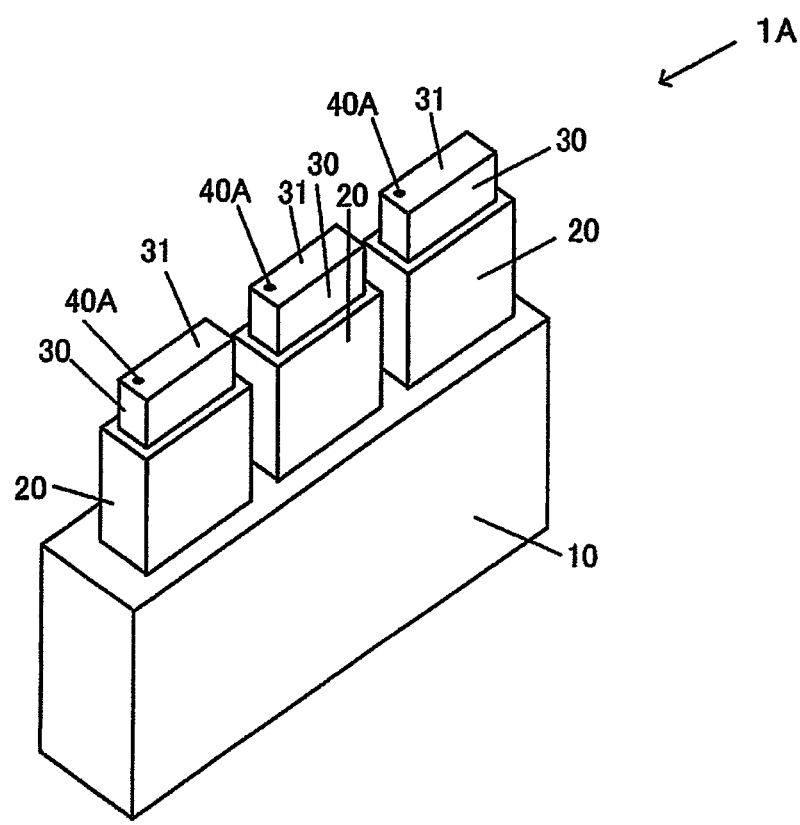
FIG. 21 is a perspective view illustrating appearance of a microsample stage according to Embodiment 2.
Figure 22A:
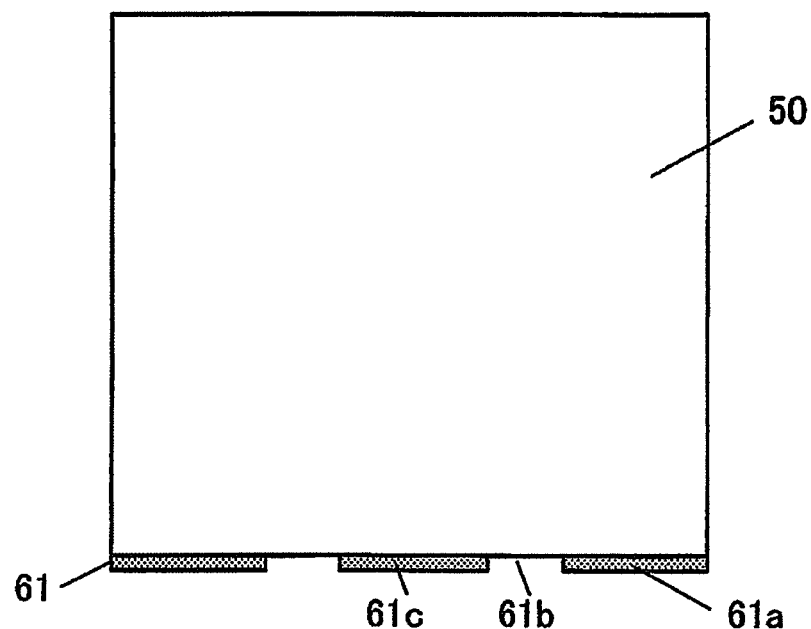
FIG. 22A is a cross-sectional view illustrating a silicon member in a process of manufacturing the microsample stage according to Embodiment 2.
Figure 22B:
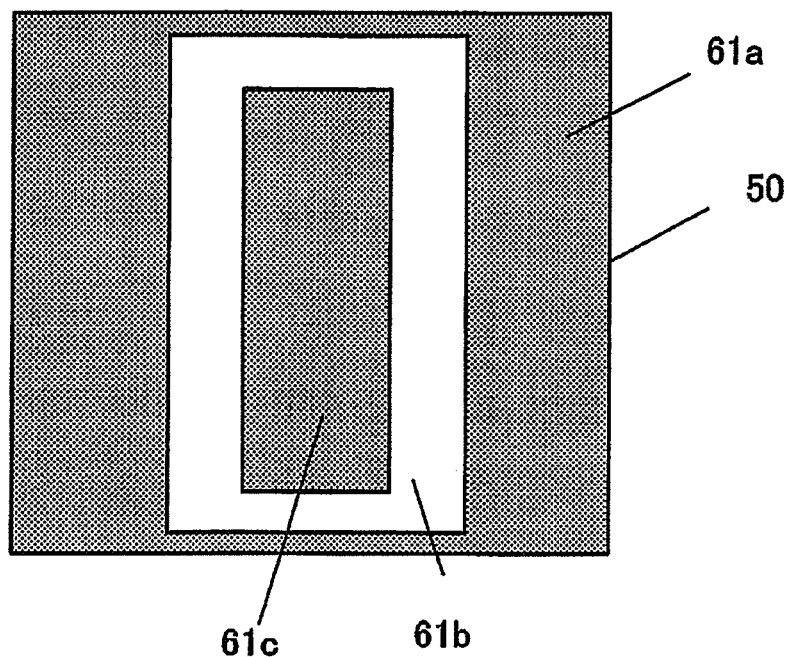
FIG. 22B is a bottom view corresponding to FIG. 22A.
Figure 23A:
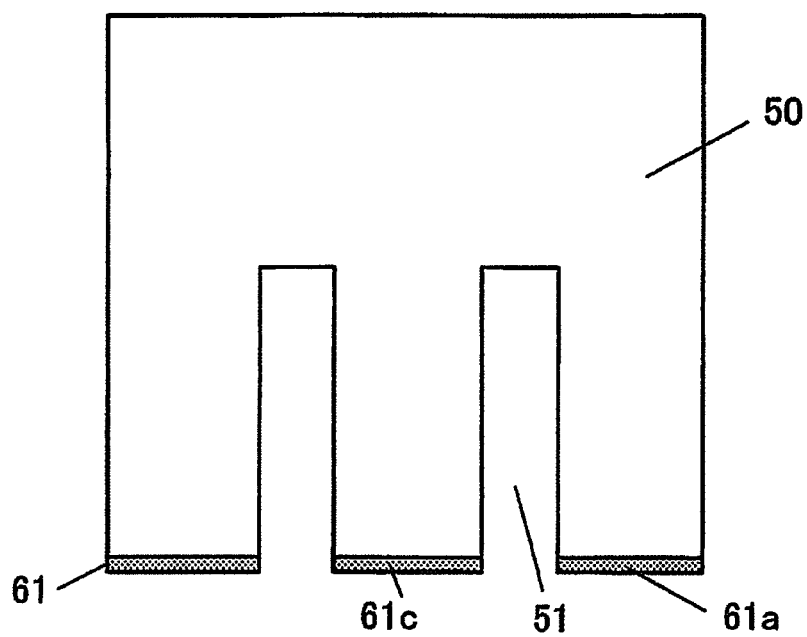
FIG. 23A is a cross-sectional view illustrating the silicon member in a process subsequent to FIG. 22A.
Figure 23B:
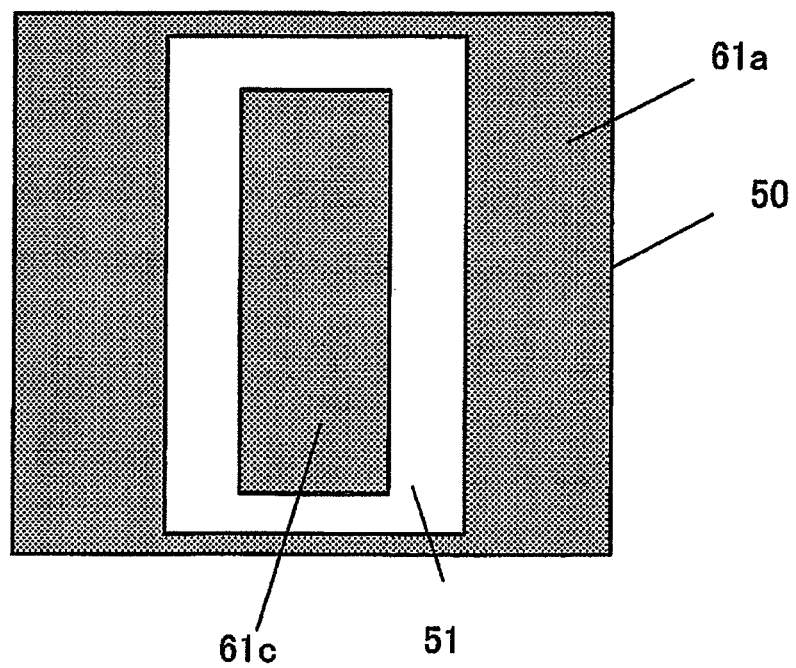
FIG. 23B is a bottom view corresponding to FIG. 23A.
Figure 24A:
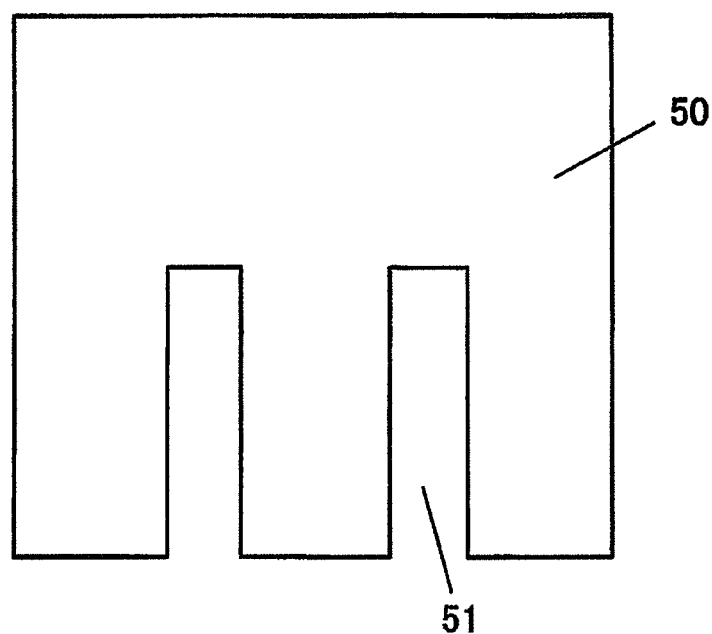
FIG. 24A is a cross-sectional view illustrating the silicon member in a process subsequent to FIG. 23A.
Figure 24B:
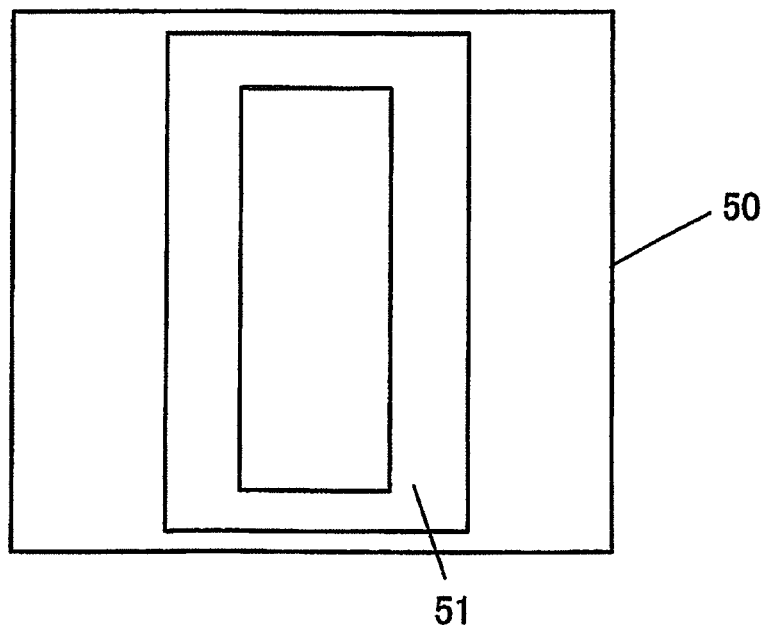
FIG. 24B is a bottom view corresponding to FIG. 24A.
Figure 25A:
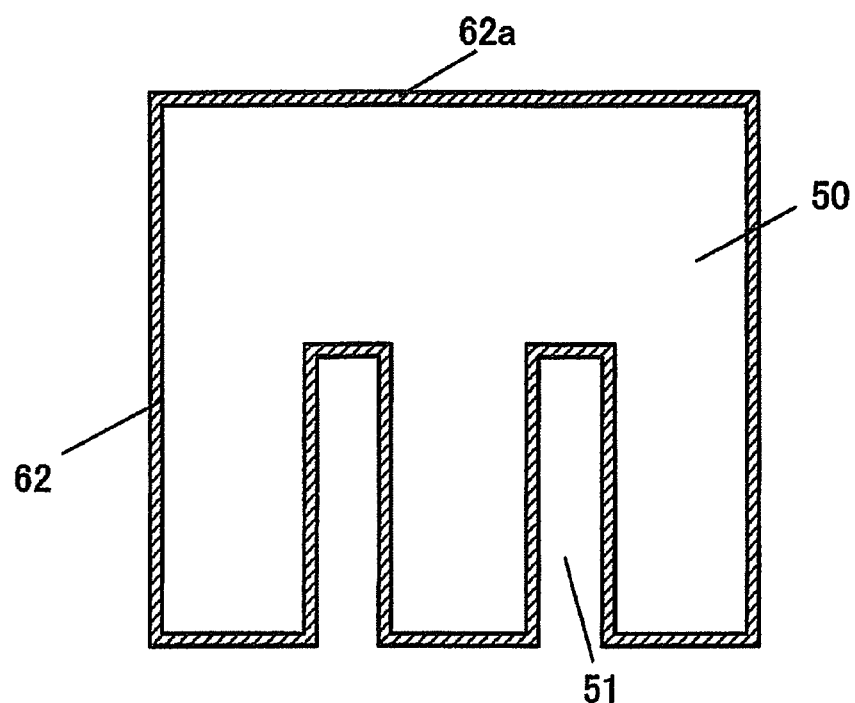
FIG. 25A is a cross-sectional view illustrating the silicon member in a process subsequent to FIG. 24A.
Figure 25B:
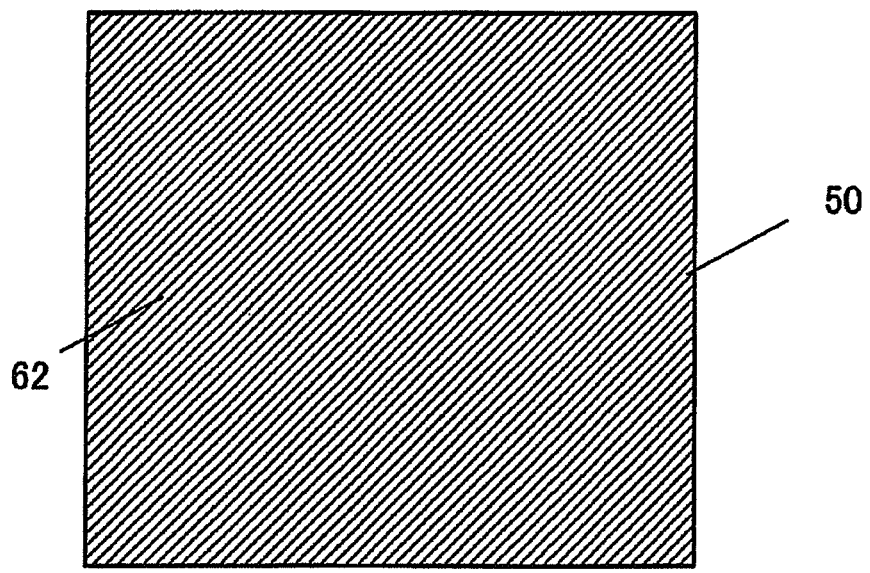
FIG. 25B is a bottom view corresponding to FIG. 25A.
Figure 26A:
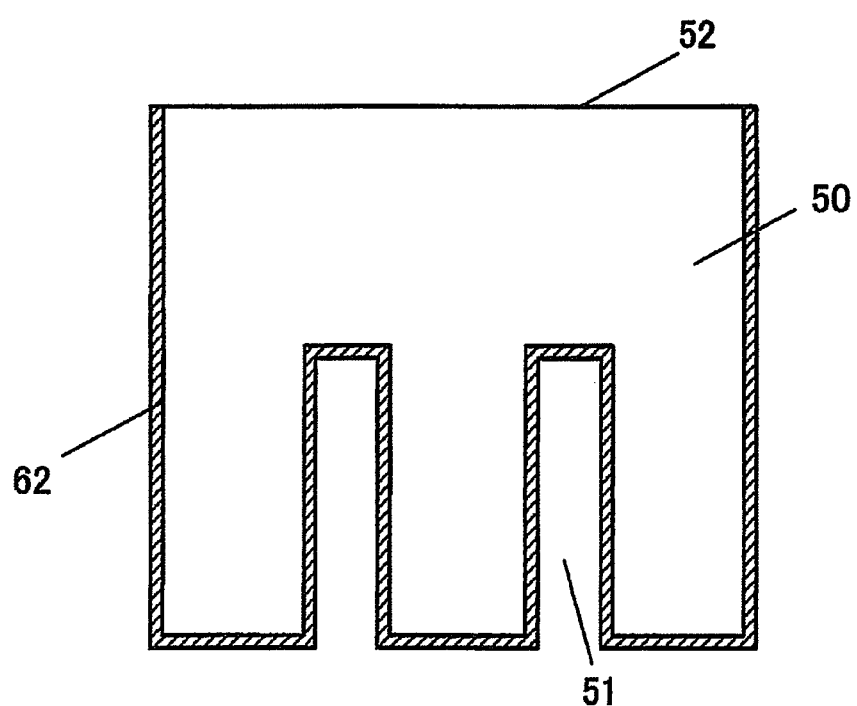
FIG. 26A is a cross-sectional view illustrating the silicon member in a process subsequent to FIG. 25A.
Figure 26B:
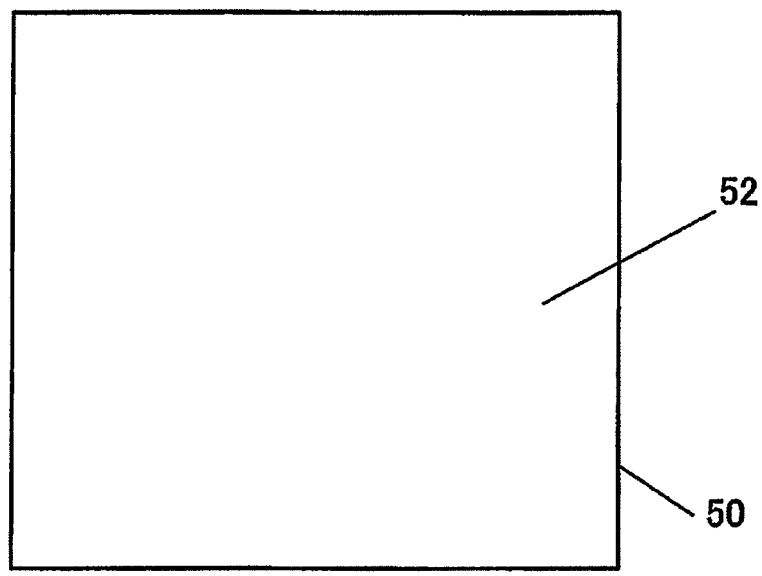
FIG. 26B is a bottom view corresponding to FIG. 26A.
Figure 27A:
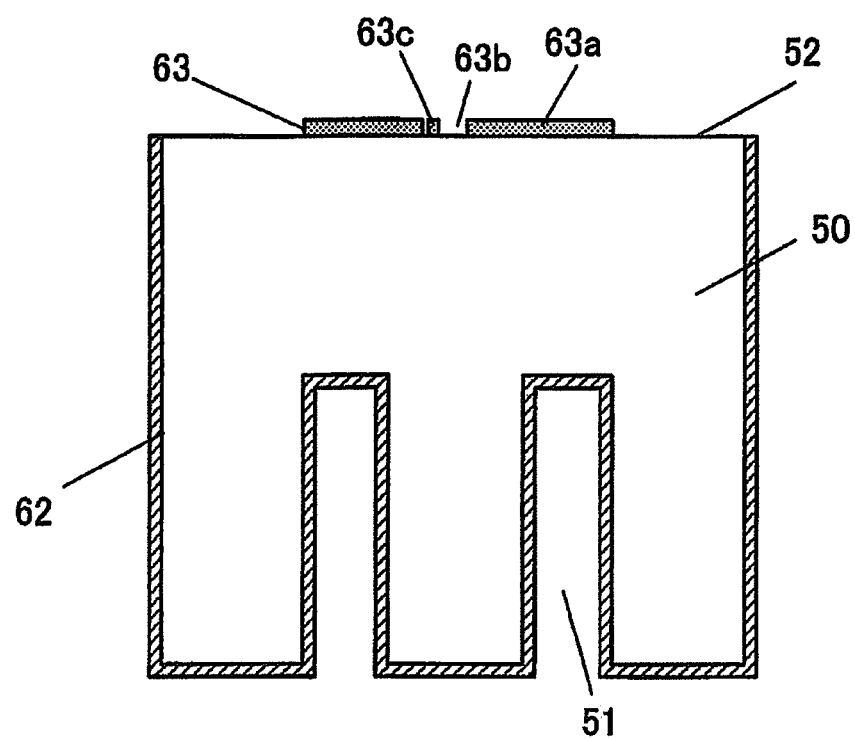
FIG. 27A is a cross-sectional view illustrating the silicon member in a process subsequent to FIG. 26A.
Figure 27B:
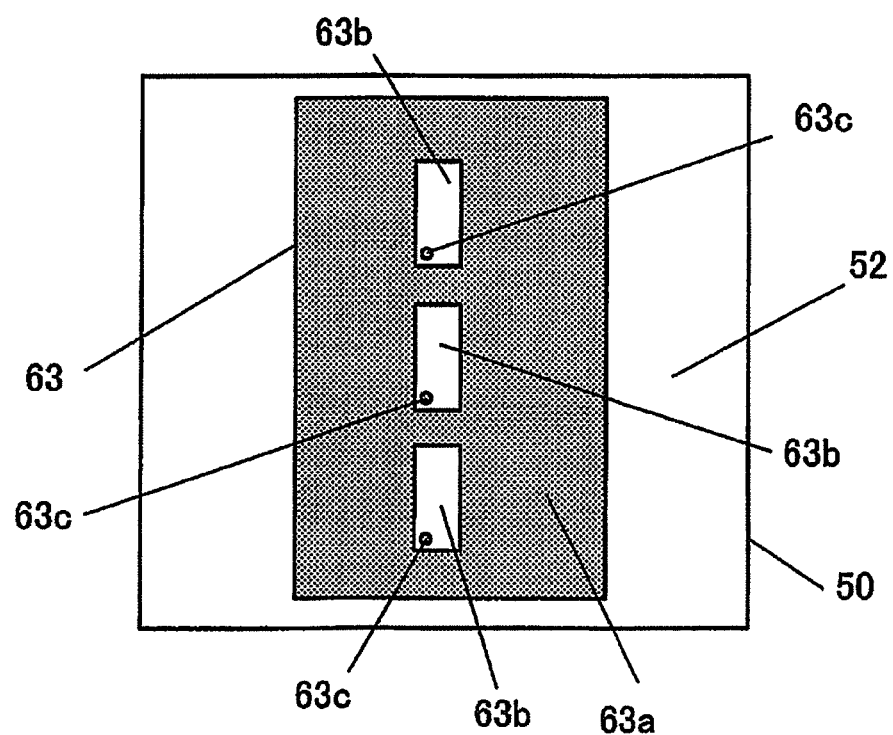
FIG. 27B is a bottom view corresponding to FIG. 27A.
Figure 28A:
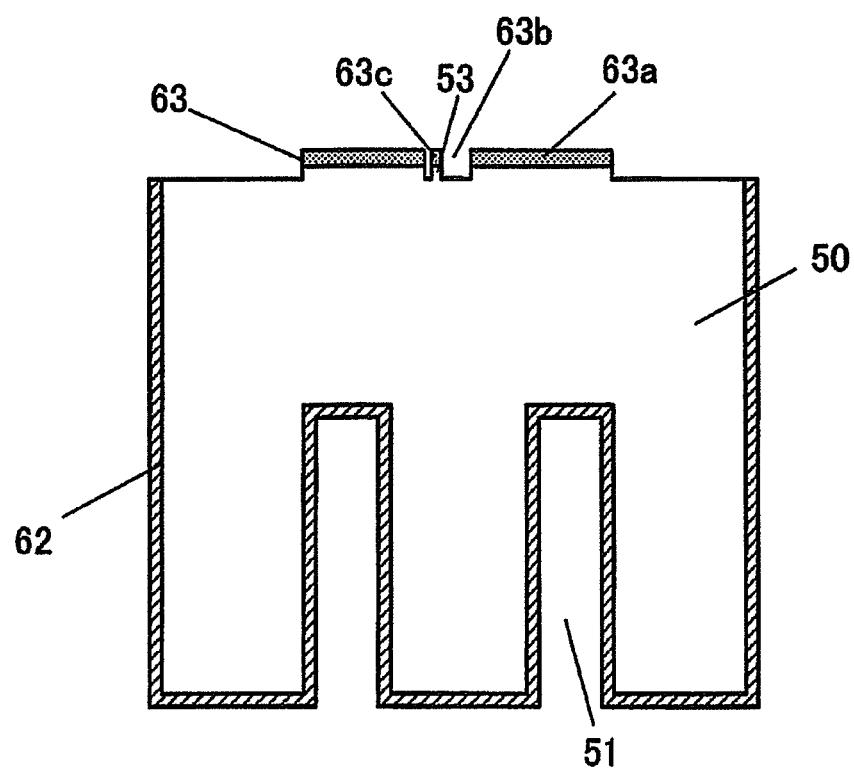
FIG. 28A is a cross-sectional view illustrating the silicon member in a process subsequent to FIG. 27A.
Figure 28B:
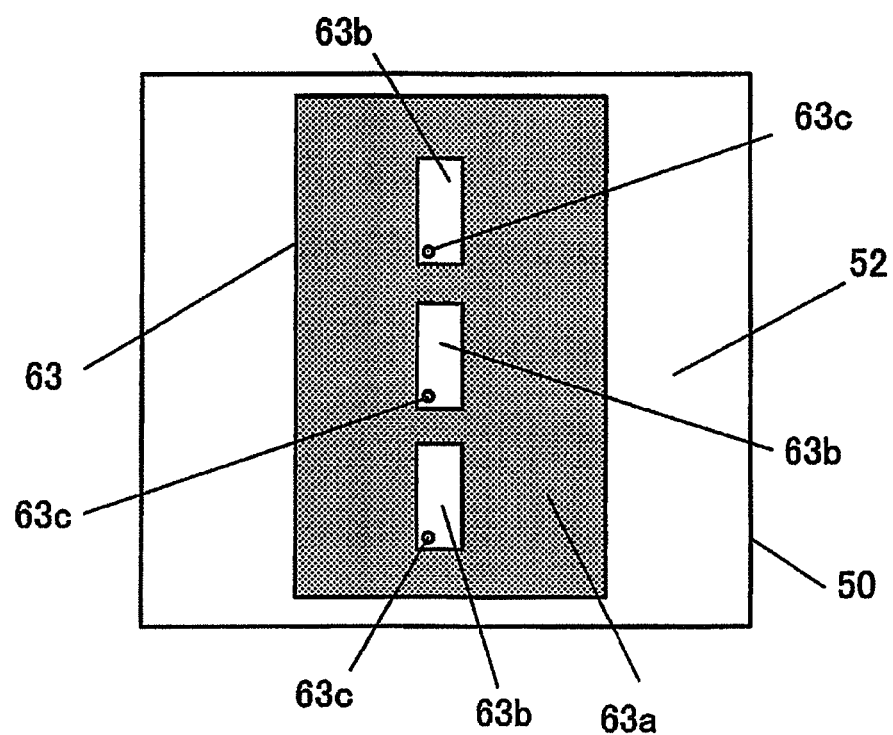
FIG. 28B is a bottom view corresponding to FIG. 28A.
Figure 29A:
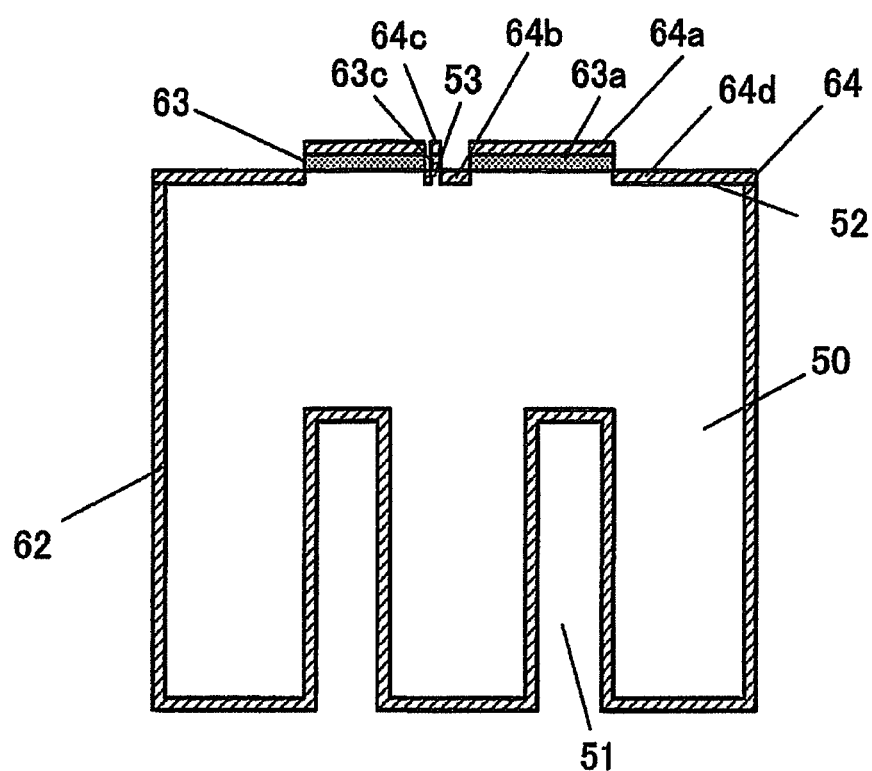
FIG. 29A is a cross-sectional view illustrating the silicon member in a process subsequent to FIG. 28A.
Figure 29B:
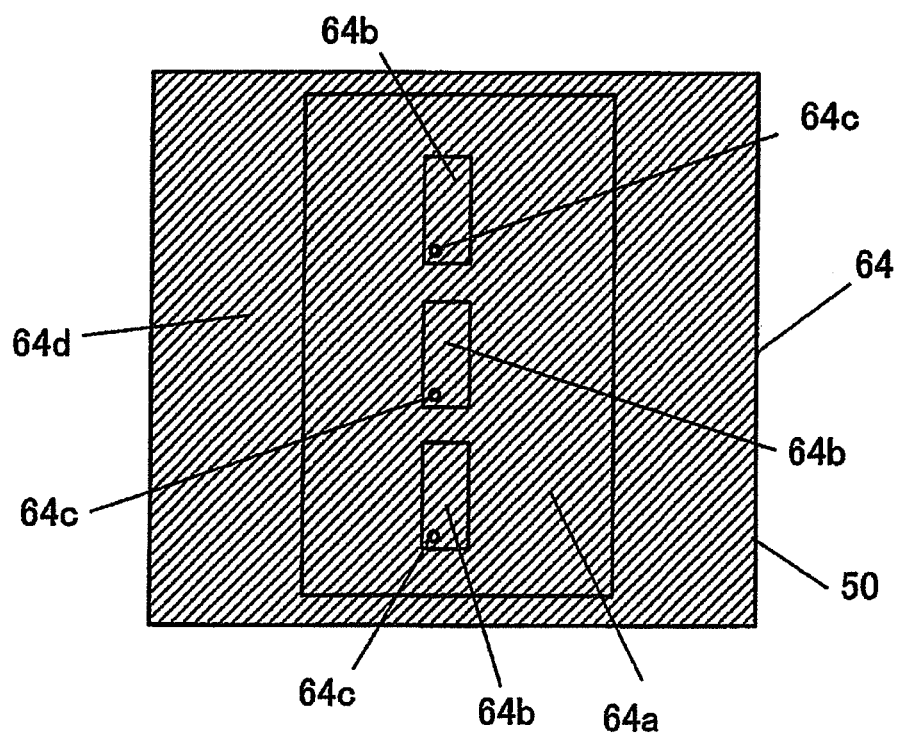
FIG. 29B is a bottom view corresponding to FIG. 29A.

FIG. 21 is a perspective view illustrating a microsample stage 1A according to Embodiment 2.

The microsample stage 1A according to Embodiment 2 is different from Embodiment 1 in that alignment marks 40A are formed as holes 57 (see FIG. 35). The microsample stage 1A according to Embodiment 2 is almost the same as the microsample stage 1 according to Embodiment 1 except for the mentioned point. Therefore, as for the microsample stages 1 and 1A according to Embodiment 1 and Embodiment 2, like reference numbers refer to like elements.

The alignment marks 40A in Embodiment 2 are formed in upper surfaces 31 of respective microsample-fixing portions 30. That is, the alignment marks 40A and the microsample-fixing portions 30 are arranged in one-to-one correspondence. The alignment marks 40A are circular holes 57 (see FIG. 34A). The shape and positions of the alignment marks 40 in 40A may be the same as those of the alignment marks 40 in Embodiment 1, or may be different. The depth of the hole 57 serving as the alignment mark 40A is not limited to a specific range as long as such a depth enables capturing an image of the alignment mark 40A and recognition of the contour of the alignment mark 40A through edge-extraction processing.

[Method of Manufacturing Microsample Stage]

With reference to FIGS. 22A to 35B and 36, a method of manufacturing the microsample stage 1A of FIG. 21.

Processes shown in FIGS. 22A to 30B in the method of manufacturing the microsample stage 1A are the same as those shown in FIGS. 2A to 10B.

Therefore, a detailed description about the processes shown in FIGS. 22A to 30B is not given herein below.

Figure 30A:
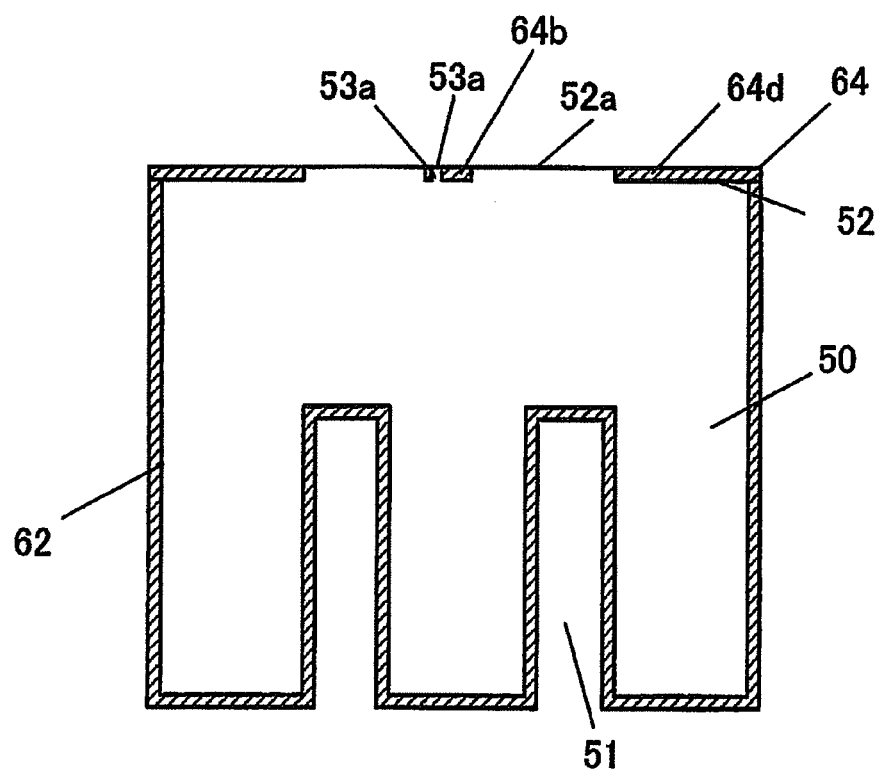
FIG. 30A is a cross-sectional view illustrating the silicon member in a process subsequent to FIG. 29A.
Figure 30B:
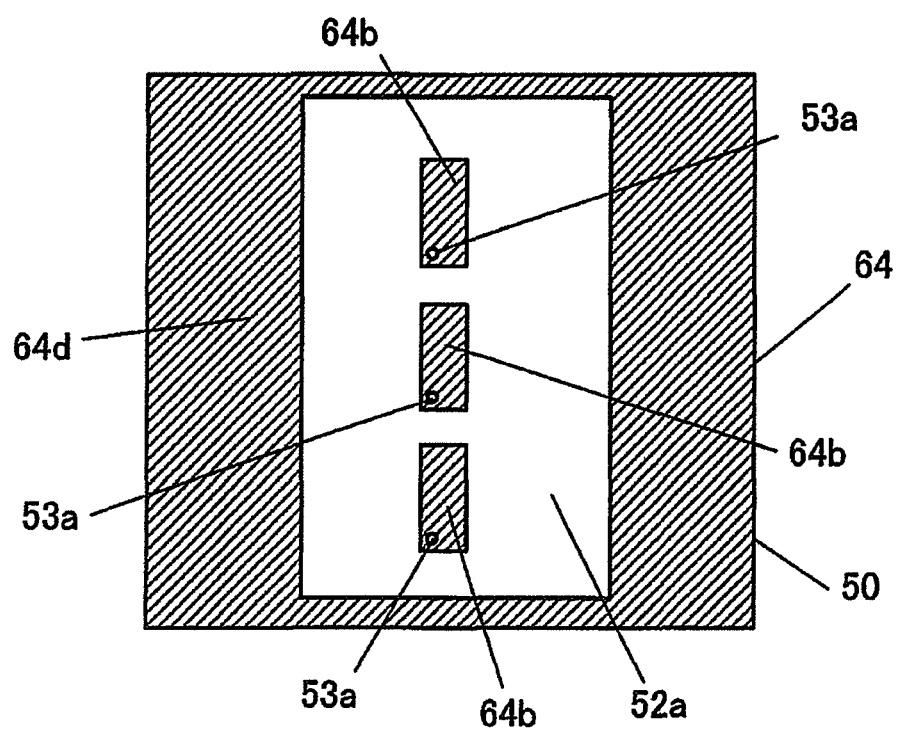
FIG. 30B is a bottom view corresponding to FIG. 30A.

With reference to FIGS. 30A and 30B, a frame-shaped recess 51 is formed in the bottom surface of a silicon member 50 and a mark-forming insulation layer 64 is formed on the upper surface 52 of the silicon member 50. The mark-forming insulation layer 64 includes a periphery portion 64d, a rectangular portion 64b, and an opening provided between the periphery portion 64d and the rectangular portion 64b. A portion 52a and 53a of the upper surface 52 of the silicon member 50 is exposed through the opening provided between the periphery portion 64d and the rectangular portion 64b.

Figure 31A:
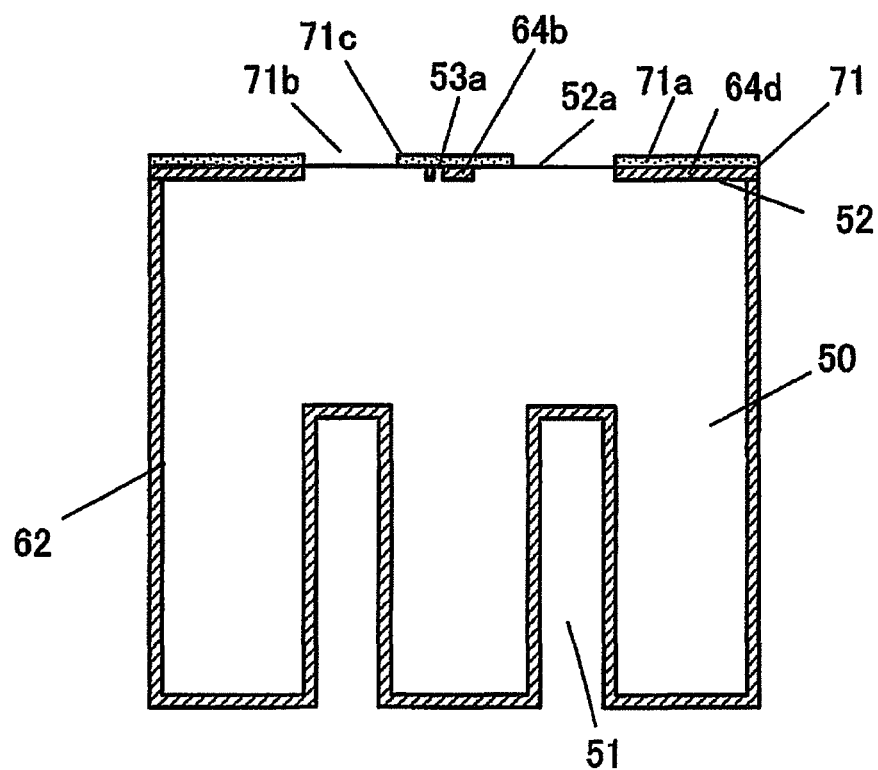
FIG. 31A is a cross-sectional view illustrating the silicon member in a process subsequent to FIG. 30A.
Figure 31B:
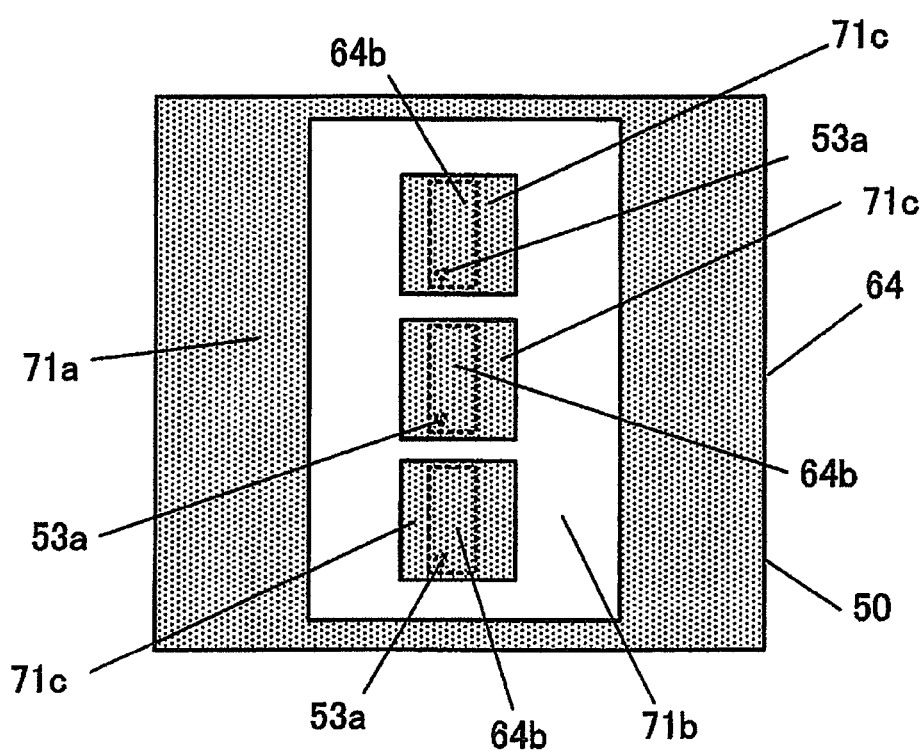
FIG. 31B is a bottom view corresponding to FIG. 31A.

FIG. 31A is a cross-sectional view illustrating the silicon member in a process subsequent to FIG. 30A, and FIG. 31B is a bottom view corresponding to FIG. 31A.

In a state in which the portion 52a of the upper surface 52 of the silicon member 50 is exposed through the opening of the mark-forming insulation layer 64, a photoresist pattern 71 is formed on the upper surface 52 of the silicon member 50 through a photolithography process.

The photoresist pattern 71 includes a periphery pattern 71a having a rectangular shape, an opening 71b formed in an approximately center portion of the periphery pattern 71a, and three island patterns 71c formed within the opening 71b. The island patterns 71c cover three portions 64b of the mark-forming insulation layer 64 illustrated in FIG. 30 and surrounding portions of the portions 64b. The shape and size, in a plan view, of each island pattern 71c are the same as those of the middle support 20 of the microsample stage 1A.

Figure 32A:
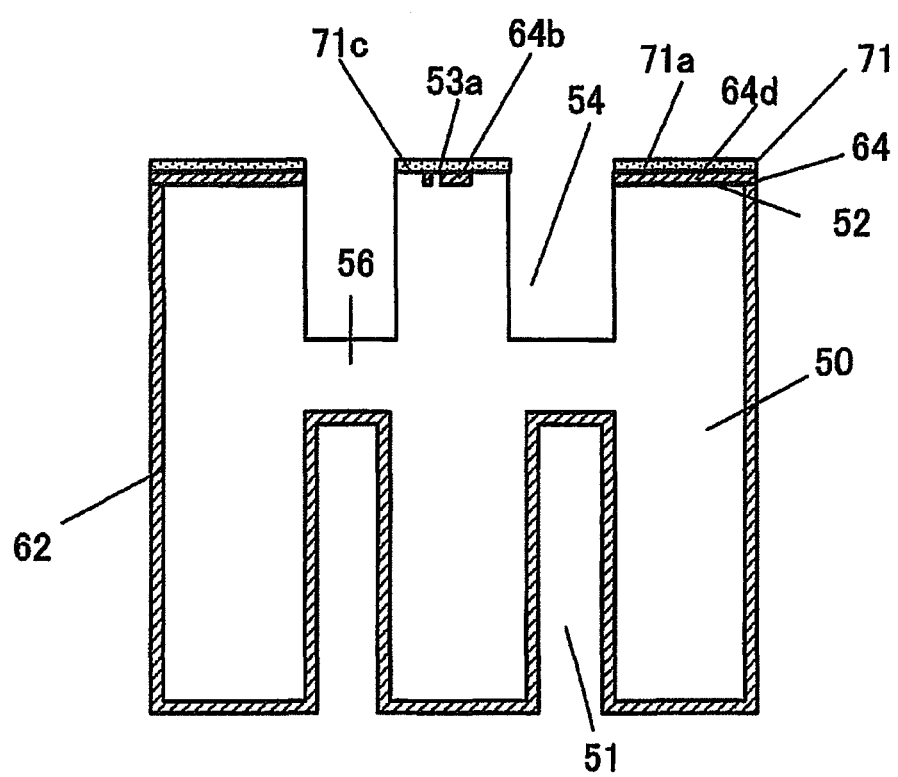
FIG. 32A is a cross-sectional view illustrating the silicon member in a process subsequent to FIG. 31A.
Figure 32B:
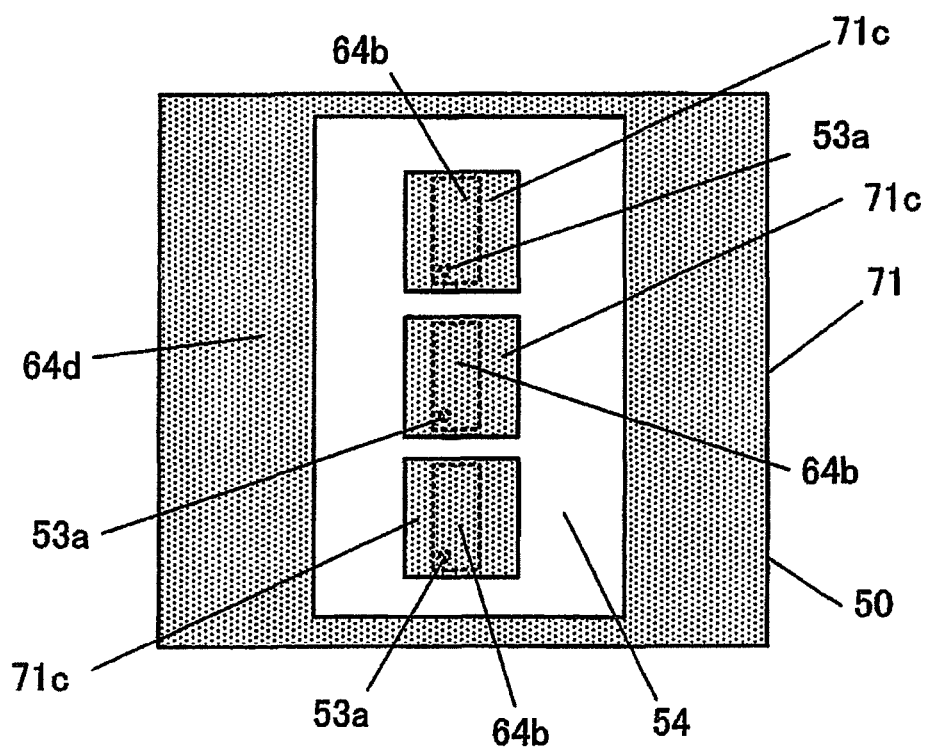
FIG. 32B is a bottom view corresponding to FIG. 32A.

FIG. 32A is a cross-sectional view illustrating the silicon member in a process subsequent to FIG. 31A, and FIG. 32B is a bottom view corresponding to FIG. 32A.

A dry etching process is performed using the photoresist pattern 71 as an etching mask to remove the portion 52a of the upper surface 52 of the silicon member 50, thereby forming a frame-shaped recess 54 in the silicon member 50. The depth of the recess 54 is higher than the height of the microsample-fixing portion 30. The depth of the recess 54 is controlled in the dry etching process such that the bottom of the recess 54 does not reach the bottom of a recess 51. That is, the dry etching process is performed such that a barrier portion 56 exists between the bottom of the recess 54 and the bottom of the recess 51.

Figure 33A:
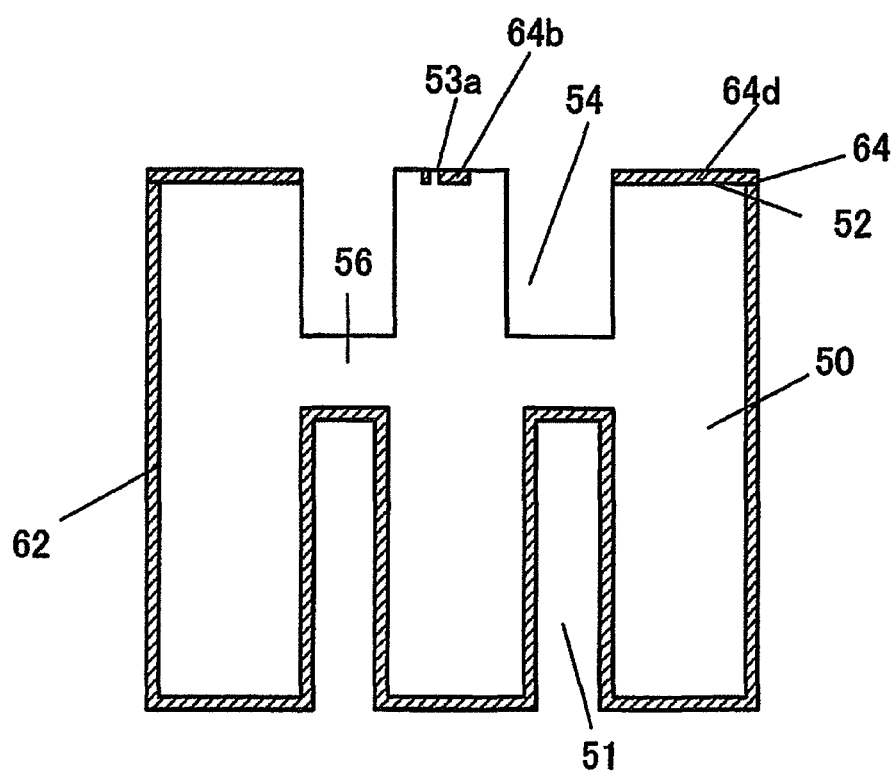
FIG. 33A is a cross-sectional view illustrating the silicon member in a process subsequent to FIG. 32A.
Figure 33B:
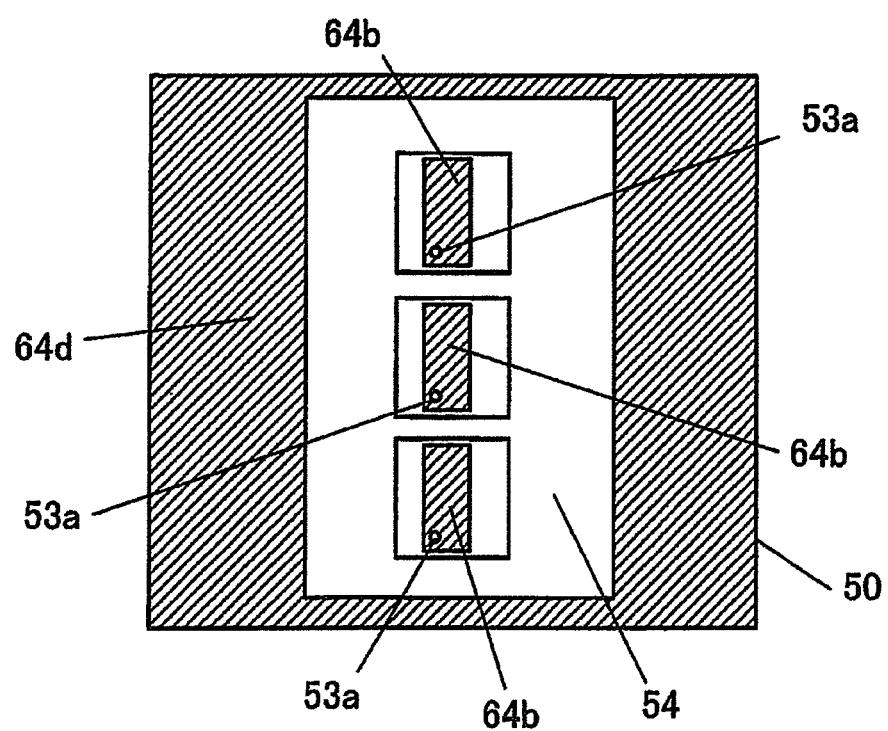
FIG. 33B is a bottom view corresponding to FIG. 33A.

FIG. 33A is a cross-sectional view illustrating the silicon member in a process subsequent to FIG. 32A, and FIG. 33B is a bottom view corresponding to FIG. 33A.

The photoresist pattern 71 formed on the upper surface 52 of the silicon member 50 is removed. After the photoresist pattern 71 is removed, a portion 53a of the upper surface 52 of the silicon member 50 is exposed.

Figure 34A:
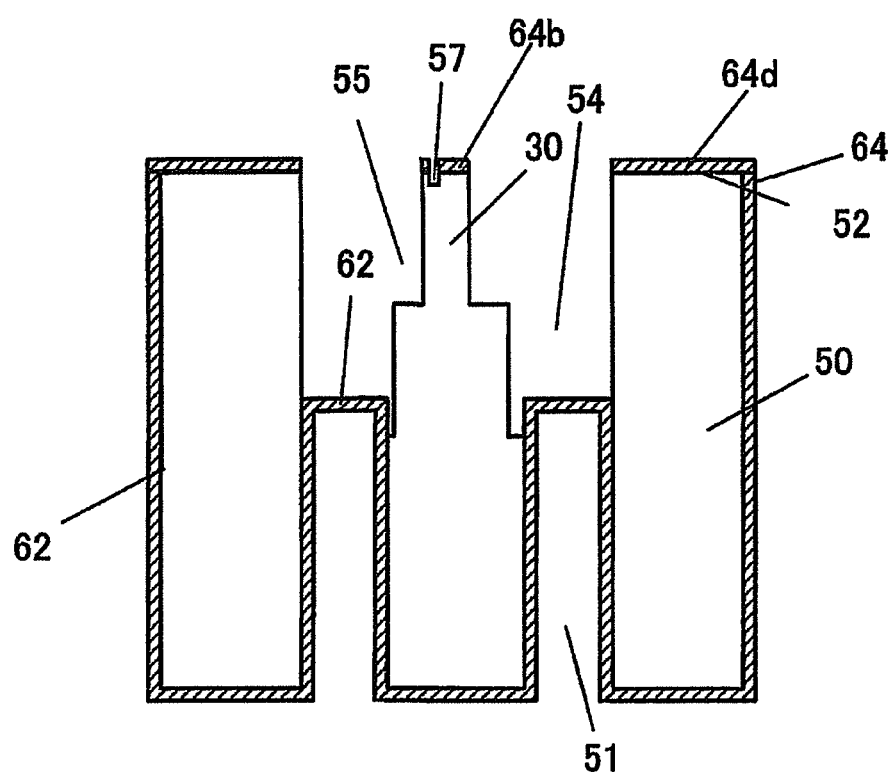
FIG. 34A is a cross-sectional view illustrating the silicon member in a process subsequent to FIG. 33A.
Figure 34B:
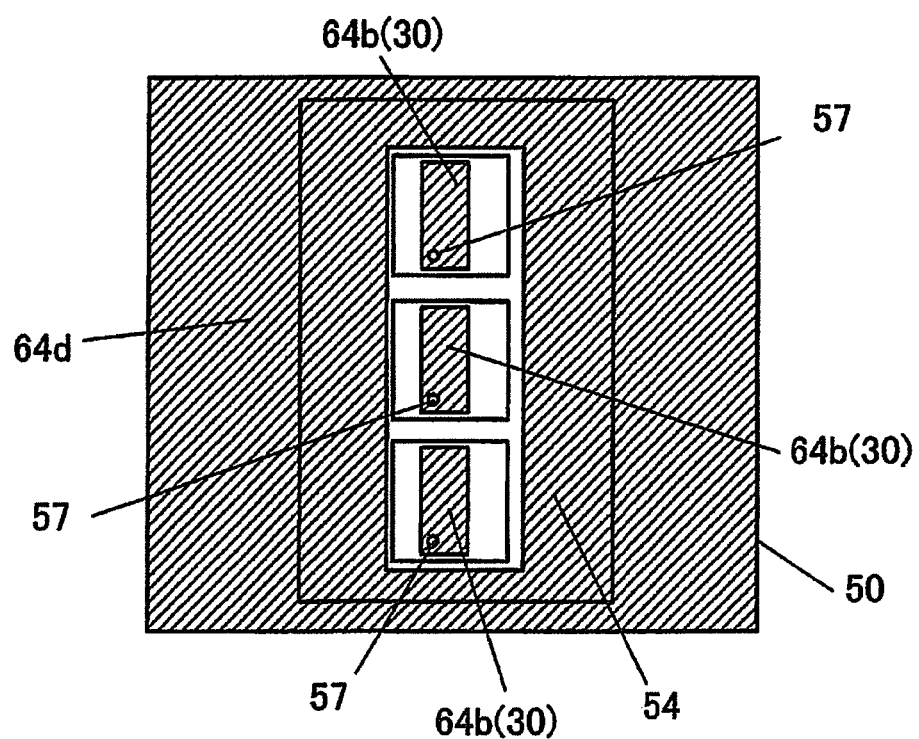
FIG. 34B is a bottom view corresponding to FIG. 34A.

FIG. 34A is a cross-sectional view illustrating the silicon member in a process subsequent to FIG. 33A, and FIG. 34B is a bottom view corresponding to FIG. 34A.

A dry etching process is performed on the upper surface 52 of the silicon member 50 using the periphery portion 64d and the rectangular portion 64b of the mark-forming insulation layer 6 as an etching mask, thereby removing the portions 52a and 53a of the upper surface 52 of the silicon member 50. After the upper surface 52 of the silicon member 50 undergoes this dry etching process, an inner recess 55 is formed inside the recess 54. The shape and size, in a plan view, of the rectangular portions 64 of the mark-forming insulation layer 64 are the same as those of the microsample-fixing portion 30. Accordingly, three microsample-fixing portions 30 are formed inside the inner recess 55 of the silicon member 50. In addition, since the portion 53a of the upper surface 52 of the silicon member 50 is etched off through the dry etching process, the holes 57 are formed in the silicon member. The holes 57 serve as the alignment marks 40A. In addition, the bather portion 56 disposed between the recess 54 and the recess 51 is also removed in the thickness direction while the dry etching process is performed. As a result, only the protective insulation layer 62 remains between the recess 54 and the recess 51. The depth of the inner recess 55 equals the height of the microsample-fixing portion 30.

Figure 35A:
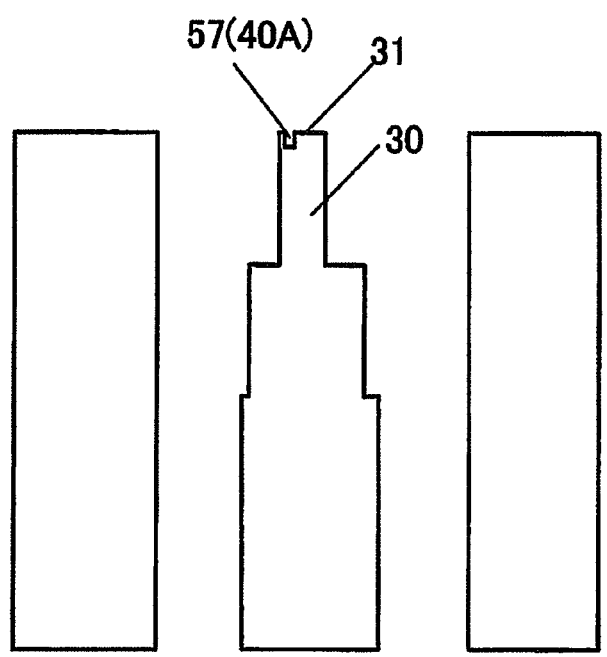
FIG. 35A is a cross-sectional view illustrating the silicon member in a process subsequent to FIG. 34A.
Figure 35B:
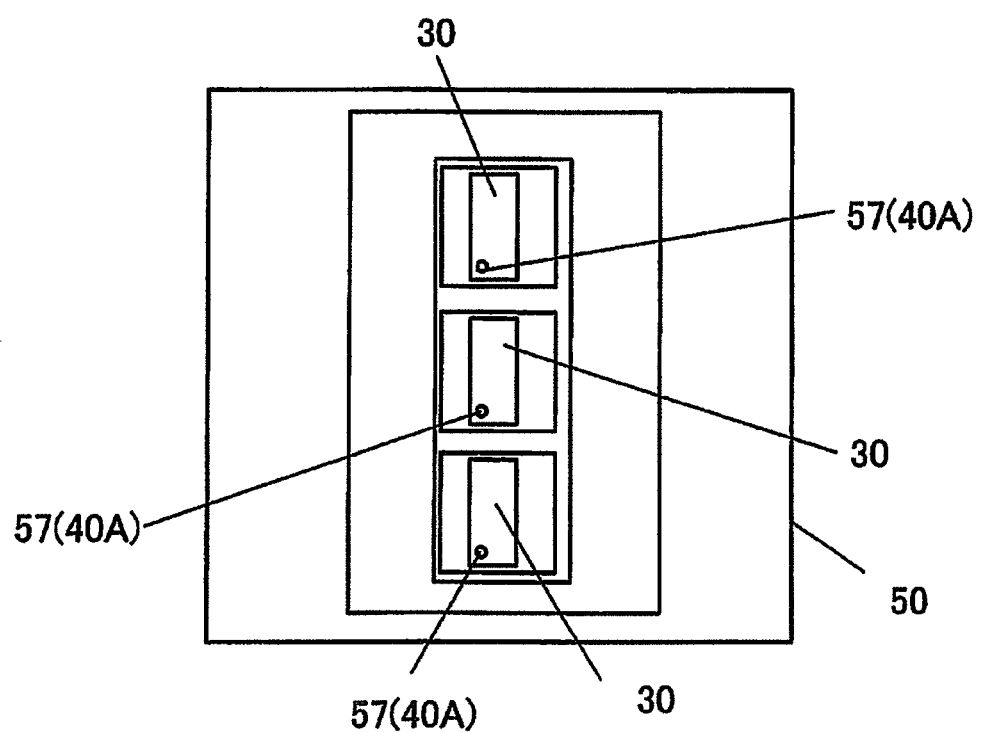
FIG. 35B is a bottom view corresponding to FIG. 35A.

FIG. 35A is a cross-sectional view illustrating the silicon member in a process subsequent to FIG. 34A, and FIG. 35B is a bottom view corresponding to FIG. 35A.

A wet etching process is performed to remove the mark-forming insulation layer 64 and the protective insulation layer 62 formed on the surface of the silicon member 50. Since the mark-forming insulation layer 64 and the protective insulation layer 62 are formed of a silicon oxide layer, the portions 64b and 64d of the mark-forming insulation layer 64 and the protective insulation layer 62 are simultaneously removed through the wet etching process performed to remove a silicon oxide layer. Since the portions 64b and 64d of the mark-forming insulation layer 64 are removed, the holes 57 are formed in the upper surface of the microsample-fixing portions 30 as the alignment marks 40A. In addition, since the protective insulation layer 62 is removed, a center portion of the silicon member 60 is isolated from the periphery portion. As a result, the microsample stage 1A shown in FIG. 21 is formed.

The microsample stage 1A according to Embodiment 2 also includes a base 10 made of silicon, microsample-fixing portions 30, and multiple alignment marks 40A. The multiple alignment marks 40A are formed on the upper surfaces 31 of the respective microsample-fixing portions 30. That is, one alignment mark 40A corresponds to one microsample-fixing portion 30. Each alignment mark 40A is not arranged in a center portion but is arranged in a periphery portion of the upper surface 31 of the corresponding microsample-fixing portion 30. Accordingly, the microsample stage 1A according to Embodiment 2 also has the first, third, fourth, fifth, and sixth advantages of the microsample stage 1 according to Embodiment 1.

Embodiment 3

Figure 36:
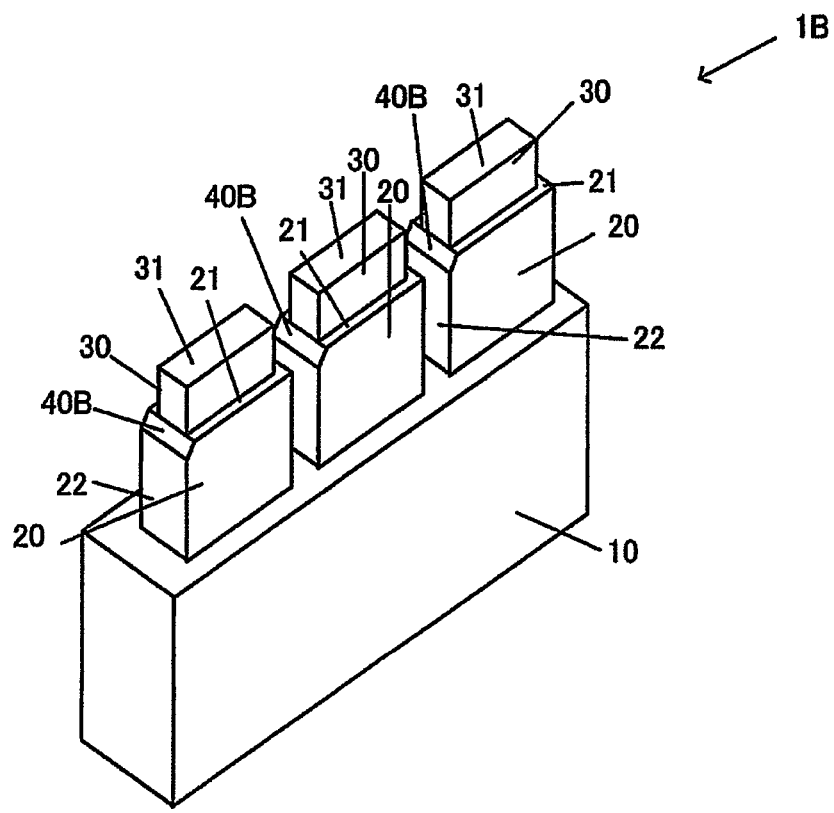
FIG. 36 is a perspective view illustrating appearance of a microsample stage according to Embodiment 3.

FIG. 36 is a perspective view illustrating appearance of a microsample stage 1B according to Embodiment 3.

The microsample stage 1B according to Embodiment 3 is different from microsamples stage 1 and 1A according to Embodiment 1 and Embodiment 2 in a point that alignment marks 40B are provided to respective middle supports 20 and the alignments marks 40B are chamfers provided at corners of the respective middle supports 20. Except for the mentioned points, the microsample stage 1B according to Embodiment 3 is the same as those of Embodiment 1 and Embodiment 2. Therefore, as for the microsample stages 1 and 1B according to Embodiment 1 and Embodiment 3, like reference numbers refer to like elements.

That is, the alignment mark 40B is a chamfer provided at a corner of the middle support 20, at which the upper surface 21 and a side surface 22 of the middle support meet each other. Specifically, the side surface 22 is a surface positioned in a direction that is perpendicular to an arrangement direction in which the middle supports 20 are arranged. The alignment mark 40B that takes the form of a chamfer can be imaged by a camera and its position is detected through image processing of the captured image. Accordingly, the microsample stage 1B according to Embodiment 3 also has the same advantages as the microsample stage 1A according to Embodiment 2.

In the microsample stage 1B according to Embodiment 3, the alignment marks 40B formed in the middle supports 20 may be provided as protrusions 53 as in Embodiment 1 or provided as holes 57 as in Embodiment 2.

On the other hand, the protrusions 53 serving as the alignment marks 40 in Embodiment 1 or the holes 57 serving as the alignment marks 40A may be substituted by chamfers used as alignment marks 40B in Embodiment 3.

Alternatively, the alignment marks 40, 40A, 40B may be notches. In the description of the present specification, the holes and the notches are collectively called recesses.

The alignment marks 40, 40A, and 40B may be formed in the base 10.

In the described embodiments, either of the microsample stage 1, 1A, and 1B includes three alignment marks 40, three alignment marks 40A, or three alignment marks 40B. However, either of the microsample stages 1, 1A, and 1B may include only one alignment mark 40, one alignment mark 40A, or one alignment mark 40B.

Figure 37A:
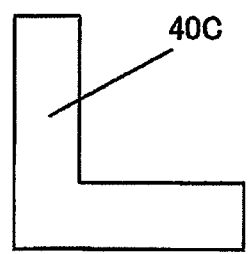
FIGS. 37A and 37B are top views illustrating modifications of an alignment mark provided to the microsample stage according to any one of Embodiment 1 to Embodiment 3.
Figure 37B:
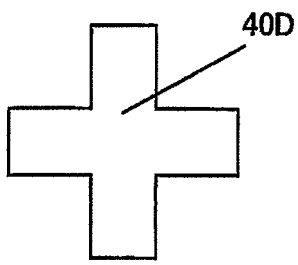

FIGS. 37A and 37B are top views illustrating modifications of the alignment mark 40, 40A, or 40B. FIG. 37A illustrates an alignment mark 40C having letter "L" shape. FIG. 37B illustrates an alignment mark 40D having a cross shape. Each of the alignment marks 40C and 40D has two strip lines perpendicular to each other. Accordingly, it is possible to determine a direction of the microsample stage 1, 1A or 1B by detecting the two strip lines. The alignment marks 40C and 40D may be substituted by circular protrusions 53 as in Embodiment 1 or by circular holes 57 as in Embodiment 2.

The multiple alignment marks 40, 40A, or 40B may be a combination of protrusions, holes, or other forms.

According to the embodiments described above, each of the microsamples stages 1, 1A, and 1B includes the middle support 20 interposed between the base 10 and the microsample-fixing portion 30. However, the microsample-fixing portion 30 may be formed directly on the base 10, without the middle support 20 interposed between the base 10 and the microsample-fixing portion 30. Alternatively, the middle support 20 may include multiple-layered supports.

In addition, in the microsample stages 1, 1A, and 1B according to the embodiments described above, three microsample-fixing portions 30 are formed on one base 10. However, there may be one microsample-fixing portion 30 on one base 10. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A microsample stage which fixes a microsample when the microsample is analyzed by an analyzer, comprising:
a base;

a plurality of middle supports which protrude from an upper surface of the base;

a microsample-fixing portion which protrudes from an upper surface of each middle support and which has a lengthwise direction and a widthwise direction; and an alignment mark associated with each microsample-fixing portion and formed on an upper surface of the microsample-fixing portion wherein at least two of the microsample-fixing portions are provided with the respective alignment marks in a one-to-one correspondence manner; and wherein the alignment marks are arranged at a periphery portion of respective ones of the microsample-fixing portions in the lengthwise direction and are arranged to deviate from the center portion of respective ones of the microsample-fixing portions in the widthwise direction.

2. The microsample stage according to claim 1, wherein the plurality of middle supports, microsample-fixing portions and alignment marks all constitute an integrated single body formed of the same material.

3. The microsample stage according to claim 1, wherein the plurality of middle supports, microsample-fixing portions and alignment marks are all formed of silicon.

4. The microsample stage according to claim 1, wherein the alignment marks are a protrusion or a recess.

5. The microsample stage according to claim 1, wherein the alignment marks are chamfers formed at the upper surface of the microsample-fixing portions.

6. A method of manufacturing a microsample stage which fixes a microsample when the microsample is analyzed by an analyzer, comprising:

etching a silicon member to form a microsample stage including a base, a plurality of middle supports which protrude from an upper surface of the base, a plurality of microsample-fixing portions which protrude from an upper surface of respective ones of the middle supports and to which a microsample is to be fixed, and a plurality of alignment marks formed on an upper surface of respective ones of the microsample-fixing portions, wherein at least two of the microsample-fixing portions are provided with the respective alignment marks in a one-to-one correspondence manner, and the alignment marks are arranged at a periphery portion of respective ones of the microsample-fixing portions in a lengthwise direction thereof and are arranged to deviate from the center portion of respective ones of the microsample-fixing portions in a direction thereof.

7. The method of manufacturing the microsample stage according to claim 6, wherein the alignment marks are a protrusion, a recess, or a chamfer.

* * * * *